(12) United States Patent
Enami et al.

(10) Patent No.: US 8,391,722 B2
(45) Date of Patent: Mar. 5, 2013

(54) TRANSMITTER, RECEIVER, TRANSCEIVER, TRANSMISSION CONTROL METHOD, RECEPTION CONTROL METHOD, OPTICAL TRANSMISSION MODULE AND ELECTRONIC DEVICE

(75) Inventors: Akira Enami, Ashiya (JP); Keisuke Uno, Ikoma (JP); Kentaro Hamana, Nara (JP); Tetsuya Nosaka, Daito (JP); Hayami Hosokawa, Kyoto (JP)

(73) Assignee: OMRON Corporation, Kyoto (JP)

( * ) Notice: Subject to any disclaimer, the term of this patent is extended or adjusted under 35 U.S.C. 154(b) by 502 days.

(21) Appl. No.: 12/673,084

(22) PCT Filed: Aug. 27, 2008

(86) PCT No.: PCT/JP2008/065258
§ 371 (c)(1),
(2), (4) Date: Feb. 11, 2010

(87) PCT Pub. No.: WO2009/034836
PCT Pub. Date: Mar. 19, 2009

(65) Prior Publication Data
US 2011/0135311 A1 Jun. 9, 2011

(30) Foreign Application Priority Data
Sep. 11, 2007 (JP) ................................. 2007-236027

(51) Int. Cl.
*H04B 10/12* (2006.01)
(52) U.S. Cl. ................... 398/147; 398/192; 398/197
(58) Field of Classification Search .................. 398/135, 398/140, 182–198, 147
See application file for complete search history.

(56) References Cited

U.S. PATENT DOCUMENTS

| 4,788,674 | A | * | 11/1988 | Maeda et al. | 369/47.51 |
| 2002/0117971 | A1 | * | 8/2002 | Ito et al. | 315/219 |
| 2003/0053384 | A1 | * | 3/2003 | Mashimo | 369/47.17 |
| 2006/0050030 | A1 | * | 3/2006 | Aoki et al. | 345/76 |
| 2007/0016823 | A1 | * | 1/2007 | Jang et al. | 714/6 |
| 2007/0064845 | A1 | * | 3/2007 | Phanse et al. | 375/348 |

FOREIGN PATENT DOCUMENTS

| JP | 60-074825 A | 4/1985 |
| JP | 63-100848 A | 5/1988 |
| JP | 05-327617 A | 12/1993 |
| JP | 07-050638 A | 2/1995 |
| JP | 11-275031 A | 10/1999 |
| JP | 2001-358661 A | 12/2001 |
| JP | 2006-229981 A | 8/2006 |

OTHER PUBLICATIONS

International Search Report w/translation from PCT/JP2008/065258 dated Sep. 30, 2008 (4 pages).
Written Opinion from PCT/JP2008/065258 dated Sep. 30, 2008 (4 pages).

* cited by examiner

*Primary Examiner* — Dzung Tran
(74) *Attorney, Agent, or Firm* — Osha Liang LLP

(57) ABSTRACT

A transmission device has a light emitting element for converting an electric signal to an optical signal and transmitting the same, and a drive section for outputting the optical signal from the light emitting element and driving the light emitting element by providing the electric signal to the light emitting element. The electric signal provided by the drive section to the light emitting element is a waveform deformed signal having a waveform in which a time required for a fall is longer than a time required for a rise in a binary signal having a signal of high level and a signal of low level.

4 Claims, 15 Drawing Sheets

Duty rate 50%

Duty rate 50%

TRANSMITTER, RECEIVER, TRANSCEIVER, TRANSMISSION CONTROL METHOD, RECEPTION CONTROL METHOD, OPTICAL TRANSMISSION MODULE AND ELECTRONIC DEVICE

TECHNICAL FIELD

The present invention relates to a transmission device for transmitting signals to perform data communication among a plurality of electronic components, a reception device for receiving the signals, and the like. In particular, the present invention relates to a light transmission device for converting a signal provided from one electronic component from an electric signal to an optical signal and transmitting the same to outside, a light reception device for converting an externally received signal from an optical signal to an electric signal and providing the same to another electronic component, and the like in an optical communication network.

BACKGROUND ART

Data communication that mainly uses an electrical wiring is currently being carried out in an electronic device including an electronic device (portable device) that can be carried such as a portable telephone. However, in recent years, development of data communication, that is, an optical communication network that employs an optical wiring that can be handled substantially similar to the electrical wiring is being advanced to more suitably implement data communication in such electronic devices.

The optical communication network is recently widely applied to an optical communication, optical network, optical interconnection, and the like as a data communication means enabling large capacity data communication at high speed. In such optical communication network, a plurality of electronic components configuring the electronic device is connected by a light transmission module (optical wiring), and data communication is carried out among the plurality of electronic components by transmitting signals of 1 GHz through the light transmission module. The signals for performing data communication are binary signals including a signal of "1" (signal of high level) and a signal of "0" (signal of low level).

The optical communication network has the following advantages. The first advantage is that optical characteristics and noise resistance property do not need to be taken into consideration when designing the electronic device. The second advantage is that the electronic device having strong mechanical characteristics can be realized at the coupling part or the like with the light guide configuring the light transmission module. The third advantage is that the plurality of electronic components can be electrically connected (connector connection), and miniaturization and lower height of the electronic device can be realized. Stating such advantages in one sentence, the optical communication network has advantages in that large capacity data communication can be easily realized and the degree of freedom in designing the electronic device for performing the large capacity data communication can be enhanced.

In the above-described optical communication network, the data communication is carried out according to the following procedure using the light transmission module.

The signal for performing data communication output from the electronic component on the transmission side is input to the light transmission device of the light transmission module as an electric signal. The light transmission device converts the signal from the electronic component on the transmission side from an electric signal to an optical signal, and transmits the same to the light reception device of the light transmission module through a light transmission medium (e.g., light guide). The light reception device converts the signal received from the light transmission device from the optical signal to the electric signal, and provides the same to the electronic component on the reception side.

As apparent from the procedure of the data communication described above, the step of data communication includes a step of processing the electric signal and a step of processing the optical signal in the optical communication network. A means for processing the electric signal and a means for processing the optical signal are suitably integrated in order to easily handle the optical communication network and promote miniaturization of the electronic device for performing data communication with the optical communication network.

Patent Document 1: Japanese Laid-Open Patent Publication No. 2006-229981 (date of publication: Aug. 31, 2006)

Non-patent Document 1: Hiroto Watanabe, Masayuki Kuwabara, Seiji Sakaguchi, Asaya Yokoyama, Haruo Miyazawa, Nobuyuki Sadakata: "One review of high frequency characteristics of FPC", Fujikura Technical Review, No. 110, P. 19-22, April, 2006.

SUMMARY

Lower power consumption is strongly desired in the transmission device that carries out data communication using the binary signals, but the data communication itself using the binary signals may not be appropriately carried out since the total current amount generated based on the binary signal decreases if the level of the binary signal is reduced for lower power consumption. As a result, in the transmission device that performs data communication using the binary signals, lower power consumption is difficult.

The light transmission device of the light transmission module will be explained as an example.

In order to achieve lower power consumption in the light transmission device of the light transmission module, the current value of the bias current for generating the signal of "0" of the binary signal is to be reduced to a current value as low as possible, and desirably, to a current value near the threshold value of the semiconductor laser (i.e., "laser threshold value" shown in FIG. 16).

If the current value of the bias current is reduced to the current value near the threshold value, the current injection amount with respect to the semiconductor laser (light emitting element) per unit time (time corresponding to one pulse of binary signal) reduces. The transition time from when the binary signal is converted from the electric signal to the optical signal and output by stimulated emission until the electrons transit from a base state to an excited state becomes long in the semiconductor laser, and a phenomenon referred to as "Turn on delay" occurs. The "Turn on delay" is a phenomenon in which the time the oscillation of the semiconductor laser starts delays. The occurrence of "Turn on delay" increases the jitter of the optical signal output from the semiconductor laser. The jitter is the delay of the rise starting time of the binary signal caused by the "Turn on delay", as shown with a reference symbol "tod" in FIG. 23. In other words, the jitter is the degradation of the waveform quality of the binary signal in the time axis direction caused by the "Turn on delay".

If the rise period (reference symbol "Tr(tod)" of FIG. 23) of the binary signal overlaps with a region of eye-mask EM due to increase in jitter caused by the "Turn on delay" as shown in FIG. 23, a bit error occurs in the light transmission device. The bit error is the false recognition of the signal of "1" in the binary signal as the signal of "0", and/or the false recognition of the signal of "0" in the binary signal as the signal of "1". In the communication including the optical communication network, communication error occurs if the bit error occurs in one or more pulses of the 10 to the $12^{th}$ power pulses, and thus there is bit error caused by the reduction in the current value of the bias current.

Therefore, low current drive is difficult since the current value of the bias current needs to be sufficiently higher than the threshold value of the semiconductor laser in the light transmission device of the light transmission module. Furthermore, reduction of the power consumption is difficult in the light transmission device of the light transmission module.

One or more embodiments of the present invention provides a transmission device, a transmission control method, and the like capable of reducing the power consumption.

One or more embodiments of the present invention provides a reception device, a reception control method, and the like capable of performing shaping of the waveform to easily receive the signal transmitted from the transmission device and to appropriately output the same to the outside with a simple circuit configuration.

A transmission device according to one or more embodiments of the present invention is characterized in that a transmission device for transmitting a binary signal having a signal of high level and a signal of low level, wherein a time required for the fall is longer than a time required for the rise in the binary signal.

Further, a transmission control method according to one or more embodiments of the present invention is characterized in that a transmission control method for transmitting a binary signal having a signal of high level and a signal of low level, wherein the binary signal is transmitted in a waveform in which a time required for the fall is longer than a time required for the rise.

According to the above configuration, the time required for the fall of the binary signal is longer than the time required for the rise of the binary signal. Thus, the degree of reduction of the total amount of current amount generated based on the binary signal per unit time becomes small compared to a case where the time required for the fall of the binary signal is the same as the time required for the rise. In this case, the time required for the fall of the binary signal is preferably made as long as possible to have the degree of reduction of the total amount of the current amount as small as possible. Therefore, the data communication by the binary signal can be appropriately performed even if the level of the binary signal is greatly lowered, and hence the transmission device according to one or more embodiments of the present invention is suited to the low current drive than the transmission device according to the prior art.

Therefore, the power consumption can be reduced.

The signal transmitted by the transmission device according to one or more embodiments of the present invention is a signal having a waveform unique to the transmission device according to one or more embodiments of the present invention, that has the signal of high level and the signal of low level, and has characteristics in that the time required for the fall is longer than the time required for the rise. However, the fall time may be made long to an extent of overlapping the region of the eye mask for the optical signal transmitted between the transmission and reception devices. In other words, the signal transmitted from the transmission device is converted to a signal that does not overlap the region of the eye mask before being output from the reception device to the external device as an electric signal.

The signal transmitted by the transmission device according to one or more embodiments of the present invention greatly differs in a waveform compared to the signal transmitted by a known transmission device. Thus, the signal transmitted by the transmission device according to one or more embodiments of the present invention and received by the reception device may become a signal that does not comply with the standard of the signal transmitted from the reception device to the external device. Thus, when receiving the signal using the known reception device, a signal necessary for data communication from the reception device to the external device is not obtained on the reception device side, that is, the quality of the signal may not satisfy the quality necessary for data communication. Therefore, the signal transmitted by the transmission device according to one or more embodiments of the present invention may not be appropriately received by the known reception device.

A reception device including a waveform shaping means for shaping the waveform needs to be used for the reception device for receiving the signal transmitted by the transmission device according to one or more embodiments of the present invention and appropriately outputting to the outside.

Conventionally, a configuration including a memory, a CDR (Clock Data Recovery), or a PLL (Phase Locked Loop) is considered for the reception device including the waveform shaping means.

However, in the conventional reception device, the power consumption on the reception device side greatly increases since the power consumed by the memory, the CDR, and the PLL is very large. The transmission device according to one or more embodiments of the present invention reduces power consumption, and thus, according to one or more embodiments of the present invention, a conventional reception device is not employed in conjunction therewith.

Power consumption can be reduced by applying a reception device including a waveform shaping means for receiving a signal and shaping a waveform of the received signal, where the received signal has a signal of high level and a signal of low level and is a signal in which a time required for the fall is longer than a time required for the rise, the waveform shaping means compares a level of the received signal and a level of a threshold value and generates a binary signal having the signal of high level and the signal of low level based on the comparison result to shape the waveform of the received signal.

Furthermore, power consumption can be reduced by applying a reception control method by the reception device for receiving a binary signal having a signal of high level and a signal of low level, where the reception device receives the binary signal with the time required for the fall being longer than the time required for the rise, compares the level of the received signal and the level of the threshold value and generates a binary signal having high level and low level based on the comparison result to shape the waveform of the received signal.

According to the above configuration, the waveform shaping means compares the level of the received signal and the level of the threshold value, and generates the binary signal having high level and low level based on the comparison result. Thus, in the reception device according to one or more embodiments of the present invention, the received signal can be shaped, and thus the signal output by the transmission device according to one or more embodiments of the present invention can be appropriately received.

Furthermore, in the reception device according to one or more embodiments of the present invention, the shaping process of the received signal can be easily performed by comparing the level of the received signal and the level of the threshold value and generating the binary signal having the signal of high level and the signal of low level based on the comparison result. Thus, the power consumption can be greatly reduced compared to the conventional configuration using the memory, the CDR, the PLL, or the like.

Therefore, the waveform can be shaped so as to easily receive the signal transmitted by the transmission device and appropriately output to the outside with a simple circuit configuration.

A transmission device according to one or more embodiments of the present invention is characterized in that a transmission device including a light emitting element for converting an electric signal to an optical signal and transmitting the same, and a drive means for outputting the optical signal from the light emitting element and driving the light emitting element by providing the electric signal to the light emitting element, wherein the electric signal provided by the drive means to the light emitting element is a waveform deformed signal having a waveform in which a time required for the fall is longer than a time required for the rise in a binary signal having a signal of high level and a signal of low level. The configuration for generating the waveform deformed signal may be a configuration of further including a waveform deforming means for deforming the binary signal to the waveform deformed signal and providing to the drive means, and the drive means may have a configuration of including a waveform deforming means for deforming the binary signal to the waveform deformed signal and providing to the light emitting element.

The reception device according to one or more embodiments of the present invention is characterized in further including a light receiving element for receiving the signal as an optical signal, converting the signal from an optical signal to an electric signal, and transmitting to the waveform shaping means.

According to the above configuration, the drive means of the transmission device according to one or more embodiments of the present invention provides the waveform deformed signal having a waveform in which the time required for the fall is longer than the time required for the rise to the light emitting element as an electric signal, and the light emitting element converts the waveform deformed signal from the electric signal to the optical signal, and transmits the same. Therefore, according to the above configuration, the degree of reduction of the current injection amount with respect to the light emitting element per unit time becomes small and the occurrence of "Turn on delay" can be suppressed even if the current value of the bias current to supply to the light emitting element is reduced to the current value near the threshold value. Thus, the occurrence of bit error due to increase in the jitter of the optical signal can be suppressed. As a result, the transmission device according to one or more embodiments of the present invention can be driven at low current and thus reduce the power consumption.

The optical signal output by the transmission device according to one or more embodiments of the present invention is a signal having a waveform unique to the transmission device according to one or more embodiments of the present invention, that has the signal of high level and the signal of low level, and has characteristics in that the time required for the fall is longer than the time required for the rise compared to the output characteristics of the signal that serves as the base of the optical signal (e.g., input signal from outside to transmission device) or the optical signal of the light emitting element (i.e., laser). However, the fall time may be made long to an extent of overlapping the region of the eye mask for the optical signal transmitted between the transmission and reception devices. In other words, the signal transmitted from the transmission device is converted to a signal that does not overlap the region of the eye mask before being output to the external device from the reception device as an electric signal.

The signal transmitted by the transmission device according to one or more embodiments of the present invention greatly differs in waveform compared to the signal transmitted by a known transmission device. Thus, the optical signal transmitted by the transmission device according to one or more embodiments of the present invention and received by the reception device may become a signal that does not comply with the standard of the signal transmitted from the reception device to the external device. The signal that does not comply with the standard on the reception device side is, for example, an optical signal in which the region of the eye mask (the region is determined as a specification of the reception device) is greatly fluctuated. Thus, when receiving the optical signal using the known reception device, a signal necessary for data communication from the reception device to the external device is not obtained on the reception device side, that is, the quality of the signal may not satisfy the quality necessary for data communication. Therefore, the optical signal transmitted by the transmission device according to one or more embodiments of the present invention may not be appropriately received by the known reception device.

A reception device including a waveform shaping means for shaping the waveform needs to be used for the reception device for receiving the optical signal transmitted by the transmission device according to one or more embodiments of the present invention and appropriately outputting to the outside.

According to the above configuration, the reception device according to one or more embodiments of the present invention receives the optical signal by the light receiving element, converts the same to the electric signal, and transmits to the waveform shaping means. Such configurations are suitable when the transmission device and the reception device according to one or more embodiments of the present invention perform data communication using the optical signal.

The transmission device according to one or more embodiments of the present invention is characterized in that a period of the signal of high level is shorter in the waveform deformed signal.

The reception device according to one or more embodiments of the present invention is characterized in performing shaping by setting the level of the threshold value low.

According to the above configuration, the period of the signal of high level is short in the waveform deformed signal transmitted by the transmission device according to one or more embodiments of the present invention. That is, since the average level per unit cycle for the binary signal is lowered in the waveform deformed signal, the power consumption can be lowered. The power consumption can be reduced by transmitting the waveform deformed signal in which the power consumption is lowered.

According to the above configuration, the reception device according to one or more embodiments of the present invention can extend the period of the signal of high level by setting the level of the threshold value low. Thus, the signal can be appropriately received by shaping the signal even if the signal in which the average level per unit cycle is low is received.

To shape the signal in which the average level per unit cycle is lowered by the reception device including the waveform shaping means according to the prior art, the received signal needs to be held by the memory and the like, and the held signal is to be expanded in the time axis direction using the CDR, the PLL, or the like.

In the reception device according to one or more embodiments of the present invention, on the other hand, the signal shaping process can be easily performed according to the above configuration by comparing the level of the received signal and the level of the threshold value, and generating the binary signal having the signal of high level and the signal of low level based on the comparison result.

The transmission device according to one or more embodiments of the present invention is characterized in that the drive means is a circuit including a current mirror circuit; and a power supply voltage is applied to that in which the light emitting element and a transistor of the current mirror circuit are connected.

According to the above configuration, the power consumption can be further reduced by realizing the drive means with a transistor circuit of one stage.

In the transmission device according to one or more embodiments of the present invention, the transistor preferably has a threshold value such that a period of the signal of high level becomes short.

Thus, the average level per unit cycle of the signal can be controlled according to the selection of the transistor configuring the current mirror circuit.

The reception device according to one or more embodiments of the present invention is characterized in that the reception device further including an analog circuit that handles a received analog signal and a digital circuit that handles a digital signal to be transmitted, wherein the waveform shaping means is arranged at a connecting portion connecting with the analog circuit in the digital circuit.

According to the above configuration, the distortion of the waveform in the received signal does not need to be taken into consideration when processing the analog signal received by the analog circuit. Thus, the consumption current can be greatly reduced, whereby the power consumption in the analog circuit can be greatly reduced.

Furthermore, according to the above configuration, the signal processing by the digital circuit can be performed since the distortion is greatly reduced in the binary signal output from the waveform shaping means. The digital circuit generally has low drive voltage compared to the analog circuit, and thus the power consumption can be further reduced by realizing the circuit of post-stage (i.e., between the waveform shaping means and the portion for transmitting the binary signal) of the waveform shaping means with the digital circuit.

The reception device according to one or more embodiments of the present invention is characterized in that the digital circuit has a high speed responsiveness than the analog circuit.

According to the above configuration, the shaping process by the waveform shaping circuit can be easily carried out by driving the digital circuit at high speed. The line width of the wiring of the digital circuit may be formed thinner than the line width of the wiring of the analog circuit in order to drive the digital circuit at higher speed than the analog circuit.

A reception device according to one or more embodiments of the present invention is characterized in that a reception device including an analog circuit that handles a received analog signal and a digital circuit that handles a digital signal to be transmitted, wherein the digital circuit includes a waveform shaping means for shaping a waveform of a signal from the analog circuit at a connecting portion connecting with the analog circuit.

According to the above configuration, the distortion of the waveform in the received signal does not need to be taken into consideration when processing the analog signal received by the analog circuit. Thus, the consumption current can be greatly reduced, whereby the power consumption in the analog circuit can be greatly reduced.

Furthermore, according to the above configuration, the signal processing by the digital circuit can be performed since the distortion is greatly reduced in the binary signal output from the waveform shaping means. The digital circuit generally has low drive voltage compared to the analog circuit, and thus the power consumption can be further reduced by realizing the circuit of post-stage (i.e., between the waveform shaping means and the portion for transmitting the binary signal) of the waveform shaping means with the digital circuit.

Moreover, according to the above configuration, the distortion of the waveform in the received signal does not need to be taken into consideration, and thus the waveform can be easily shaped even when driving the analog circuit by a current value lower than the current value at which it can be stably driven.

In other words, the current value at which it can be stably driven sufficiently is generally determined in the analog circuit. However, in the reception device according to one or more embodiments of the present invention, the analog circuit may be driven by a current value at which it can be stably driven sufficiently. The reception device according to one or more embodiments of the present invention is suitably used when driving the analog circuit by the current value at which it can be stably driven sufficiently is difficult.

The waveform shaping means is suitably one or a plurality of inverters in the digital circuit, and is one or a plurality of amplifiers in the analog circuit.

According to the above configuration, the process by the waveform shaping means can be easily performed by a simple circuit of one or a plurality of inverters and/or amplifiers. When performing the process by the waveform shaping means using the amplifier, the signal gain of the amplifier is set sufficiently large. The inverter and/or amplifier can perform the process more accurately the greater the number arranged. The effect of reducing the power consumption is obviously greater the smaller the number of inverter and/or amplifier arranged. That is, the degree of freedom in the circuit scale and the design of the reception device can be appropriately set according to the number of inverters, that is, the extent of accuracy of the process of het binary signal.

A transmission and reception device according to one or more embodiments of the present invention is characterized in that a transmission and reception device including a transmission device for transmitting a binary signal which has a signal of high level and a signal of low level and in which a time required for the fall is longer than a time required for the rise, and a reception device including a waveform shaping means for receiving a signal which has a signal of high level and a signal of low level and in which a time required for the fall is longer than a time required for the rise, and for shaping a waveform of the received signal, wherein the waveform shaping means of the reception device compares a level of the received signal and a level of a threshold value and generates a binary signal having a signal of high level and a signal of low level based on the comparison result to shape the waveform of the received signal.

According to the above configuration, the time required for the fall of the binary signal is longer than the time required for the rise of the binary signal. Thus, the degree of reduction of the total amount of current amount generated based on the binary signal per unit time becomes small compared to a case where the time required for the fall of the binary signal and the time required for the rise are the same. In this case, the time required for the fall of the binary signal is preferably as long as possible to reduce the degree of reduction of the total amount of current amount as much as possible. Thus, the data communication by the binary signal can be appropriately performed even if the level of the binary signal is greatly reduced, and hence the transmission device of the transmission and reception device according to one or more embodiments of the present invention is suited for low current drive.

According to the above configuration, the waveform shaping means compares the level of the received signal and the level of the threshold value, and generates the binary signal having high level and low level based on the comparison result. Thus, the received signal can be shaped in the reception device according to one or more embodiments of the present invention, and hence the signal output by the transmission device according to one or more embodiments of the present invention can be appropriately received.

Furthermore, in the reception device of the transmission and reception device according to one or more embodiments of the present invention, the shaping process can be easily performed by comparing the level of the received signal and the level of the threshold value and generating a binary signal including a signal of high level and a signal of low level based on the comparison result. Therefore, the power consumption can be greatly reduced compared to the conventional configuration using the memory, the CDR, the PLL, and the like.

Therefore, the power consumption can be reduced, and the waveform can be shaped to easily satisfy the signal quality necessary for data communication with a simple circuit configuration.

A light transmission module according to one or more embodiments of the present invention may include the transmission device, the reception device, and a transmission medium for transmitting the binary signal from the transmission device to the reception device. Further, for performing data transmission, an electronic device may include the light transmission module.

The power consumption can be reduced in the light transmission module or the entire electronic device.

As described above, the transmission device according to one or more embodiments of the present invention is a transmission device for transmitting a binary signal including a signal of high level and a signal of low level, where the binary signal is configured such that the time required for the fall is longer than the time required for the rise.

Therefore, the power consumption can be reduced.

As described above, the reception device according to one or more embodiments of the present invention is a reception device including a waveform shaping means for receiving the signal and shaping the waveform of the received signal, where the received signal is a signal which has a signal of high level and a signal of low level and in which the time required for the fall is longer than the time required for the rise, and the waveform shaping means compares the level of the received signal and the level of the threshold value and generates the binary signal having the signal of high level and the signal of low level based on the comparison result to shape the waveform of the received signal. The reception device according to one or more embodiments of the present invention includes an analog circuit for handling the received analog signal and a digital circuit for handling the digital signal to be transmitted, where the digital circuit includes a waveform shaping means for shaping the waveform of the signal from the analog circuit at the connecting portion for connecting with the analog circuit.

Therefore, the waveform can be shaped to easily satisfy the signal quality necessary for data communication with a simple circuit configuration.

Therefore, the transmission and reception device according to one or more embodiments of the present invention includes a transmission device for transmitting a binary signal which has a signal of high level and a signal of low level and in which the time required for the fall is longer than the time required for the rise, and a reception device including a waveform shaping means for receiving the signal which has a signal of high level and a signal of low level and in which the time required for the fall is longer than the time required for the rise, and for shaping the waveform of the received signal, where the waveform shaping means of the reception device compares the level of the received signal and the level of the threshold value and generates a binary signal having a signal of high level and a signal of low level based on the comparison result to shape the waveform of the received signal.

Therefore, the power consumption can be reduced, and the waveform can be shaped to easily satisfy the signal quality necessary for data communication with a simple circuit configuration.

BRIEF DESCRIPTION OF THE DRAWINGS

FIG. 17(a) is a view showing an example of a case of transmitting an optical signal to the outside by a transmission device according to one or more embodiments of the present invention, and a case of receiving the optical signal from the outside by a reception device according to one or more embodiments of the present invention, FIG. 17(b) is a diagram showing a waveform of the binary signal input to the transmission device from the electronic component, FIG. 17(c) is a diagram showing a waveform of the binary signal transmitted to the outside by the transmission device, FIG. 17(d) is a diagram showing another waveform of the binary signal transmitted to the outside by the transmission device, FIG. 17(e) is a diagram showing a waveform of the binary signal output by the reception device, and FIG. 17(f) is a view showing another embodiment of the present invention and is a block diagram showing a configuration of a transmission and reception device.

DESCRIPTION OF SYMBOLS 1, 1a to 1c light transmission device (transmission device)
2, 2a waveform deforming circuit (waveform deforming means)
3, 3a, 31, 32 laser drive circuit (drive means)
4 light emitting element
5, 5a duty ratio adjustment circuit
11, 11a to 11d light reception device (reception device)
12 light receiving element
13 to 15 waveform shaping circuit (waveform shaping means)
100, 100a to 100g light transmission module
130 portable telephone (electronic device)
160 hard disc recording and reproducing device (electronic device)
A1 analog circuit
AMP1 feedback amplifier
AMP2 amplifier
D1 digital circuit
11 to 13 inverter
T1 to T7 transistor

DETAILED DESCRIPTION

In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

A transmission device according to one embodiment of the present invention will be described using FIG. 1 to FIG. 5, and FIG. 16.

Figure 1:
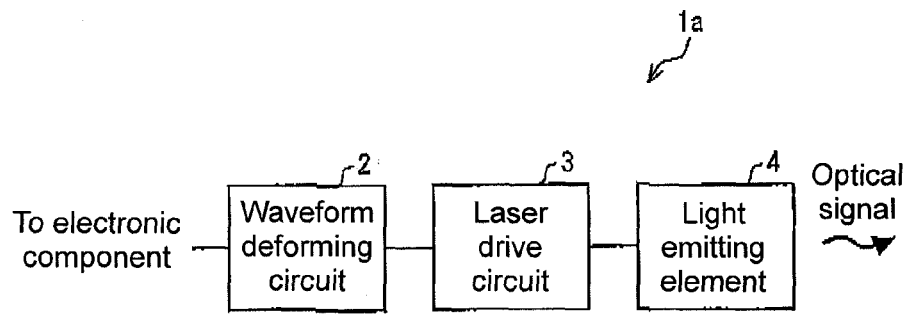
FIG. 1 is a view showing one embodiment of the present invention, and is a block diagram showing a configuration of a transmission device.

FIG. 1 is a block diagram showing a configuration of a transmission device according to the present embodiment.

A light transmission device (transmission device) 1a shown in FIG. 1 is configured to include a waveform deforming circuit (waveform deforming means) 2, a laser drive circuit (drive means) 3, and a light emitting element 4.

The light transmission device 1a shown in FIG. 1, as well as, a light transmission device 1b (see FIG. 7(a)) and a light transmission device 1c (see FIG. 8), to be hereinafter described, have an electronic component (not shown) connected at the pre-stage, and receive a binary signal (signal for performing data communication) including a signal of "1" (signal of high level) and a signal of "0" (signal of low level) from the electronic component.

Figure 2:
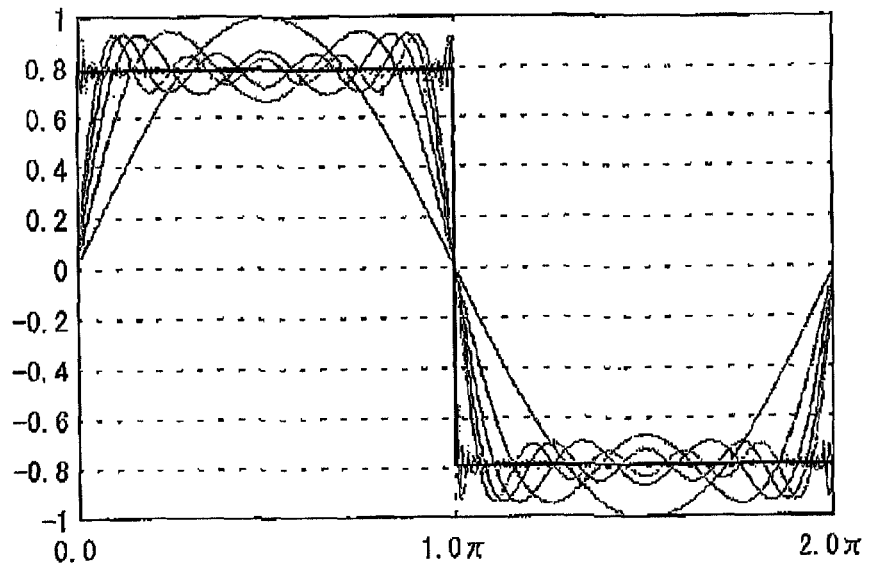
FIG. 2 is a view showing a waveform of a binary signal input to the transmission device.
Figure 3:
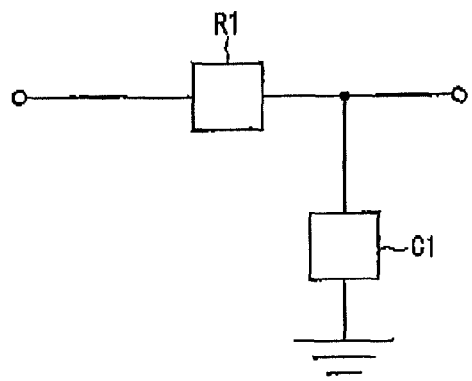
FIG. 3 is a view showing a typical configuration of a CR circuit including a capacitor and a resistor.

FIG. 2 is a view showing a waveform of the binary signal input to the transmission device according to one or more embodiments of the present invention. As shown in FIG. 2, the binary signal is actually generated by overlapping signals having various frequency components, and contains a signal component (harmonic component) of high frequency.

The binary signal from the electronic component is input to the waveform deforming circuit 2 of the light transmission device 1a.

The waveform deforming circuit 2 performs a process of having the time required for the fall of the input binary signal longer than the time required for the rise. The waveform deforming circuit 2 outputs the waveform deformed signal, in which the time required for the fall is made longer than the time required for the rise with respect to the output characteristics of the optical signal in the light emitting element 4, to the laser drive circuit 3.

In the following description, the time required for the rise of the input binary signal is referred to as "Tr" and the time required for the fall of the input binary signal is referred to as "Tf". Furthermore, in the following description, the process of having the Tf of the input binary signal longer than the Tr is referred to as "blunting the waveform" or simply "blunting", and a state in which such process is performed (i.e., state of fall in the signal subjected to the process) is referred to as "blunt of the waveform" or simply "blunt".

The waveform deforming circuit 2 can be implemented by a well-known differential circuit (CR circuit including capacitor C1 and resistor R1, see FIG. 3), but is not limited thereto. The specific process of the waveform deforming circuit 2 is not particularly limited as long as the Tf of the binary signal can be made longer than the Tr.

Figure 4:
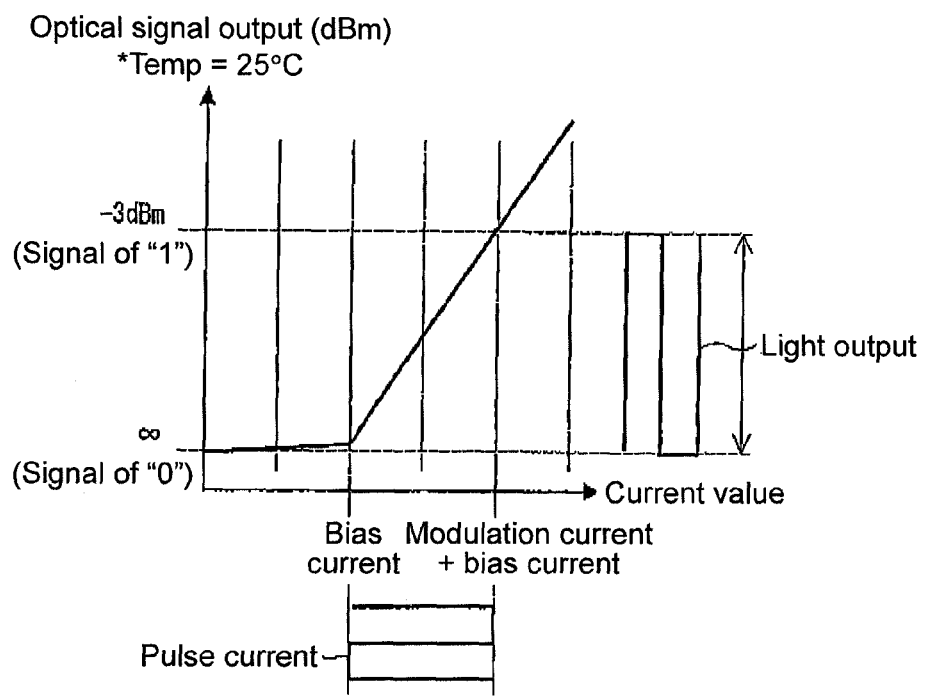
FIG. 4 is a graph showing a relationship of a bias current and a modulation current with a binary signal.

The laser drive circuit 3 generates a bias current and a modulation circuit (drive current) based on the binary signal from the waveform deforming circuit 2, and switches the bias current and the current, in which the modulation current is superimposed on the bias current, by a modulation signal from a modulation signal source (not shown) to perform direct modulation (see "pulse current" of FIG. 4). The laser drive circuit 3 then drives the light emitting element 4 (see FIG. 4) by causing the light emitting element 4 to emit light according to the signal (electric signal) generated through the direct modulation and outputting the optical signal (see "light output" of FIG. 4).

The light emitting element 4 is a semiconductor laser for outputting the optical signal (i.e., converting binary signal from electric signal to optical signal) by emitting light according to the signal from the laser drive circuit 3, and transmits the optical signal to the outside. The light emitting element 4 includes a laser diode and the like.

The type of light emission of the light emitting element 4 serving as the semiconductor laser may be a surface emitting semiconductor laser, or a type (so-called end face emitting type) where the laser light is exited parallel to a semiconductor wafer (not shown).

The process of the waveform deforming circuit 2 with respect to the binary signal will now be described using FIG. 5.

Figure 5:
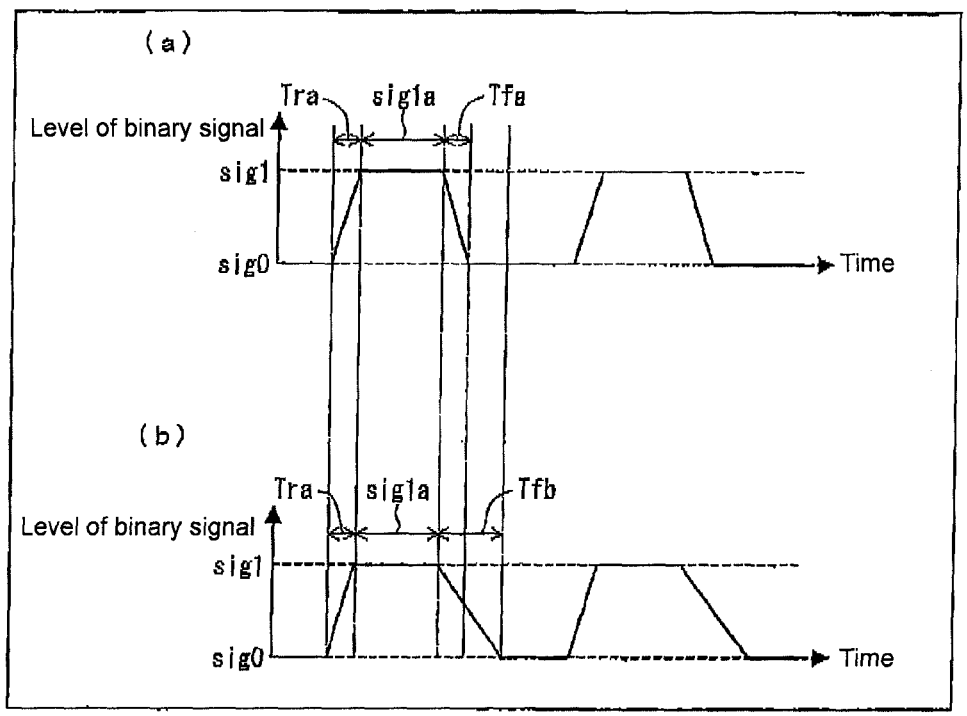
FIG. 5 is a graph showing a waveform of the binary signal before being input to a waveform deforming circuit according to one or more embodiments of the present invention, and a graph showing the waveform of the binary signal output from the waveform deforming circuit.

FIG. 5(a) is a graph showing the waveform of the binary signal before being input to the waveform deforming circuit 2. FIG. 5(b) is a graph showing the waveform of the binary signal output from the waveform deforming circuit 2. In each graph of FIG. 5, the vertical axis indicates the level of binary signal, and the horizontal axis indicates the time (between signal of "1" and signal of "0" in binary signal). "sig1" in the figures of the present application shows the level of the signal of "1" of the binary signal, and "sig0" shows the level of the signal of "0" of the binary signal.

The binary signal shown in FIG. 5(a) has the time required for the rise, Tra, the time required for the fall, Tfa, and the period of the signal of "1", sig1a. Here, Tra and Tfa are substantially equal time.

When the binary signal shown in FIG. 5(a) is input to the waveform deforming circuit 2, the waveform deforming circuit 2 blunts the waveform of the binary signal. Specifically, the process of having the Tfa long (i.e., Tfa becomes Tfb) is performed on the binary signal shown in FIG. 5(a).

As a result, the binary signal shown in FIG. 5(a) is deformed to the binary signal shown in FIG. 5(b) in which the time required for the fall is longer than Tfa or Tfb by the waveform deforming circuit 2, and is output to the laser drive circuit 3. The waveform deforming circuit 2 transmits the binary signal shown in FIG. 5(b) to the outside through the laser drive circuit 3 and the light emitting element 4.

According to the above-described configuration, lower power consumption in the entire transmission device can be expected while suppressing the influence by the "Turn on delay".

The reasons are as follows.

The current value of the bias current for generating the signal of "0" of the binary signal is demanded to be reduced to a current value as low as possible, or desirably to a current value in the vicinity of the threshold value of the semiconductor laser (reference symbol "laser threshold value" of FIG. 16) in order to achieve lower power consumption in the transmission device.

If the current value of the bias current is reduced to the current value in the vicinity of the threshold value, the current injection amount with respect to the semiconductor laser per unit time (time corresponding to one pulse of binary signal) reduces. Thus, the transition time from when the semiconductor laser converts the binary signal from the electric signal to the optical signal and outputs the same by stimulated emission until the electrons transit from the base state to the excited state becomes long. If the transition time becomes long, the jitter of the optical signal output from the semiconductor laser increases, and the "Turn on delay" occurs.

With the above-described configuration, the duty ratio itself increases in a case where the binary signal is made blunt compared to a case where the binary signal is not made blunt, and thus the degree of reduction of the current injection amount with respect to the semiconductor laser per unit time becomes small compared to a case where the binary signal is not made blunt. In the present application, the "duty ratio" refers to the average level per unit cycle of the signal. Thus, the influence by the "Turn on delay" is minimized even if the current value of the bias current is reduced to the current value in the vicinity of the threshold value. Therefore, lower power consumption in the entire transmission device can be expected while suppressing the influence of the "Turn on delay" (see FIG. 16).

In the present embodiment, the waveform deforming circuit 2 is arranged at the pre-stage of the laser drive circuit 3, but is not limited thereto. In other words, the waveform deforming circuit 2 may be arranged at the post-stage of the laser drive circuit 3 and the pre-stage of the light emitting element 4 in the light transmission device 1a.

In the above case, the binary signal from the electronic component is input to the waveform deforming circuit 2 through the laser drive circuit 3. The waveform deforming circuit 2 performs the process of blunting the waveform of the binary signal, and outputs the binary signal with blunt waveform to the light emitting element 4. The light emitting element 4 emits light according to the binary signal from the waveform deforming circuit 2, and transmits the optical signal to the outside.

In the optical communication network, the transmission device for transmitting the optical signals needs to include a laser, which is a surface emitting semiconductor laser (vertical cavity surface emitting laser: VCSEL) for converting the binary signal from the electric signal to the optical signal and outputting the same, and a laser drive circuit for receiving the binary signal from the electronic component on the transmission side, performing identification and modulation of the binary signal, and applying the modulated binary signal to the laser. Conventionally, the laser and the laser drive circuit are arranged on an integrated circuit substrate different from each other, and thus the wire and the conducting wire pattern for connecting the integrated circuit substrates are further required.

The signals transmitted at high speed are generally handled in the optical communication network. Thus, on the transmission device side, the signal waveform of the binary signal greatly distorts unless impedance matching (impedance matching is hereinafter referred to as "matching") is performed between each integrated circuit substrate and the wire or the conducting wire pattern. The impedance is an alternating resistance value, and refers to the synthesis of the capacitor component, the inductance component, and the resistor component.

Furthermore, on the transmission device side, the distortion of the binary signal caused by the mutual modulation product of second order or high order generated by the laser exists in addition to the distortion of the binary signal caused by the matching failure.

That is, on the transmission device side, the distortion of the transmitted signal is to be taken into consideration. An attempt to reduce the distortion has been conventionally carried out on the distortion of the signal.

A technique for reducing the distortion of the binary signal related to the matching failure includes inserting an impedance adjustment circuit (see Non-patent Document 1), changing the wiring distance of the wire or the conducting wire pattern and/or the laser to be selected, and the like.

Patent Document 1 discloses a technique in which a pre-distortion circuit of generating a distortion signal, in which the magnitude is substantially equal to the distortion component and the sign is the opposite of the distortion component, that is, the distortion component is canceled, is arranged at the pre-stage of the laser, as a technique of reducing the distortion of the binary signal caused by the mutual modulation product of second order of high order generated by the laser.

However, if a circuit for reducing distortion is inserted on the transmission device side to reduce the distortion of the binary signal caused on the transmission device side, the circuit scale may increase on the transmission device side. Generally, the power consumption on the transmission device side tends to become greater than the power consumption on the reception device side. Thus, if the circuit scale increases on the transmission device side, this becomes a large fault to lowering the power consumption in the entire electronic device.

When responding to the distortion of the binary signal related to the matching failure by changing the wiring distance of the wire or the conducting wire pattern and/or the laser to be selected, a very strict designing and manufacturing need to be performed. Thus, the degree of freedom in designing the electronic device reduces, and the manufacturing cost increases.

In the light transmission device according to one or more embodiments of the present invention, the binary signal can be provided to the light emitting element as an electric signal, as a waveform deformed signal having a waveform in which the time required for the rise and the time required for the fall are different from each other, and the light emitting element can convert the electric signal to the optical signal and can transmit the same. That is, since the distortion of the binary signal that occurs on the transmission device side does not need to be reduced, a circuit for reducing the distortion does not need to be inserted on the transmission device side, or strict designing and manufacturing do not need to be performed by changing the wiring distance of the wire and the conducting wire pattern and/or the laser to be selected.

Therefore, the degree of freedom in designing the electronic device can be ensured and the increase in the manufacturing cost can be suppressed while reducing the circuit scale.

Second Embodiment

Figure 6:
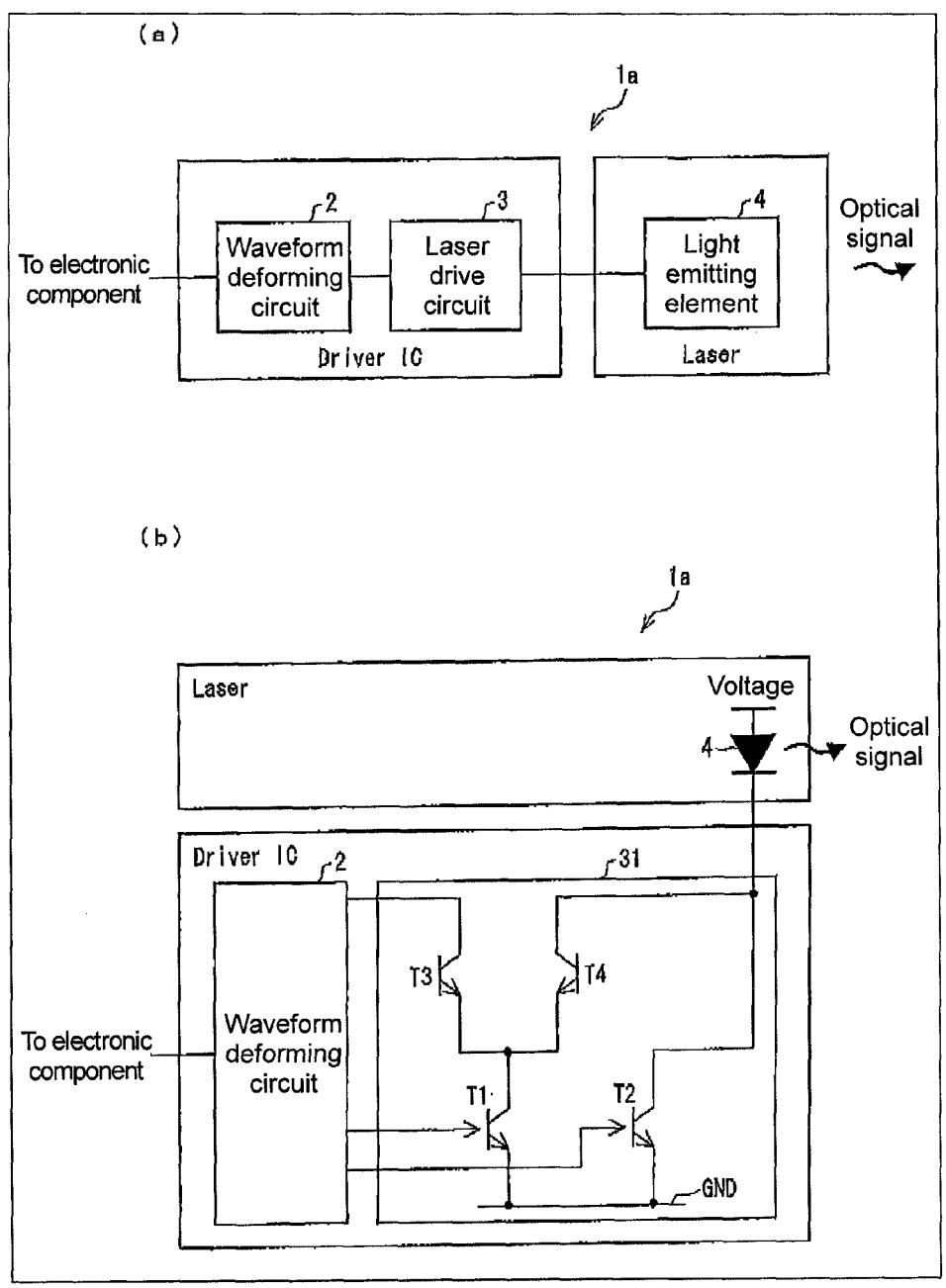
FIGS. 6(a) and (b) are views showing another embodiment of the present invention, and are a block diagram showing a configuration of the transmission device implemented on the substrate and a view showing a specific circuit configuration of the drive means arranged in the transmission device.

FIG. 6(a) is a block diagram showing a configuration of the transmission device shown in FIG. 1 implemented on the substrate.

When the light transmission device 1a described above is implemented on the substrate, the waveform deforming circuit 2 and the laser drive circuit 3 are implemented on the same substrate (reference symbol "Driver IC"), as shown in FIG. 6(a).

The light emitting element 4 may be implemented on a substrate (see FIG. 6(a), reference symbol "Laser") different from the waveform deforming circuit 2 and the laser drive circuit 3, or may be implemented on the same substrate as the waveform deforming circuit 2 and the laser drive circuit 3, although not shown.

Specifically, the laser drive circuit 3 is suitably configured by a circuit shown in FIG. 6(b).

FIG. 6(b) is a view showing a specific circuit configuration of the laser drive circuit 3 arranged in the light transmission device 1a. As shown in FIG. 6(b), description will be made using an example in which the light emitting element 4 as well as the waveform deforming circuit 2 and the laser drive circuit 3 are implemented on substrates different from each other, but the configuration of the transmission device according to the present embodiment is not limited thereto. In other words, the light emitting element 4 may be arranged on the same substrate as the waveform deforming circuit 2 and the laser drive circuit 3.

The laser drive circuit 31 shown in FIG. 6(b) is used as the laser drive circuit 3 of the light transmission device 1a.

The laser drive circuit 31 shown in FIG. 6(b) is configured to include transistors T1 to T4. A case that the NPN bipolar transistor is used for the transistors T1 to T4 will be described.

The transistor T1 has the base connected to the waveform deforming circuit 2 by a line for supplying the potential at the base of the transistor T1 (drive voltage of the laser drive circuit 31 supplied from a power supply (not shown)), the emitter connected to the ground (reference symbol "GND"), and the collector connected to the emitter of the transistor T3 and the emitter of the transistor T4. The transistor T2 has the base connected to the waveform deforming circuit 2, the emitter connected to the ground, and the collector connected to the light emitting element 4. The collector of the transistor T3 is connected to the waveform deforming circuit 2, and the collector of the transistor T4 is connected to the light emitting element 4.

The signal from the waveform deforming circuit 2 is constantly input to the base of the transistor T2. The transistor T2 thereby generates the bias current.

The signal from the waveform deforming circuit 2 is constantly input to the base of the transistor T1. The transistor T1 thereby generates the modulation current. It is to be recognized that the modulation current flows from the collector of the transistor T1 to the emitter of the transistor T4 from the switching of the transistor T3 and the transistor T4, that is, the timing the transistor T3 and the transistor T4 is conducted until the period of the binary signal "1" is finished, and flows from the collector of the transistor T1 to the emitter of the transistor T3 at other times.

If the binary signal is the signal of "0", the light emitting element 4 is driven only by the bias current and thus does not output the desired output power. If the binary signal is the signal of "1", the light emitting element 4 is driven by the current in which the modulation current is superimposed on the bias current, and thus outputs the desired output power. The laser drive circuit 31 emits the light emitting element 4 according to the binary signal by switching such two cases based on the binary signal (i.e., direct modulation).

In the present embodiment, the laser drive circuit 31 is configured to include the NPN bipolar transistors for the transistors T1 to T4, but is not limited thereto. In other words, the laser drive circuit 31 may be configured to include a MOS (Metal Oxide Semiconductor) field effect transistor such as CMOS (Complementary Metal Oxide Semiconductor) as the transistors T1 to T4. In this case, the laser drive circuit 31 may be configured to use the gate of the MOS field effect transistor in place of the base of the NPN bipolar transistor, the source of the MOS field effect transistor in place of the emitter of the NPN bipolar transistor, and the drain of the MOS field effect transistor in place of the collector of the NPN bipolar transistor in the configuration including the NPN bipolar transistors as the transistors T1 to T4.

The power supply voltage from the power supply is structurally determined by the waveform band and the current amount to be used. The drive voltage per one stage of transistor (i.e., base-emitter voltage in a specific NPN bipolar transistor or source-gate voltage in a specific MOS field effect transistor) is structurally determined by the size of the transistors T1 to T4 to be used and the manufacturing steps of the laser drive circuit 31.

Third Embodiment

Figure 7:
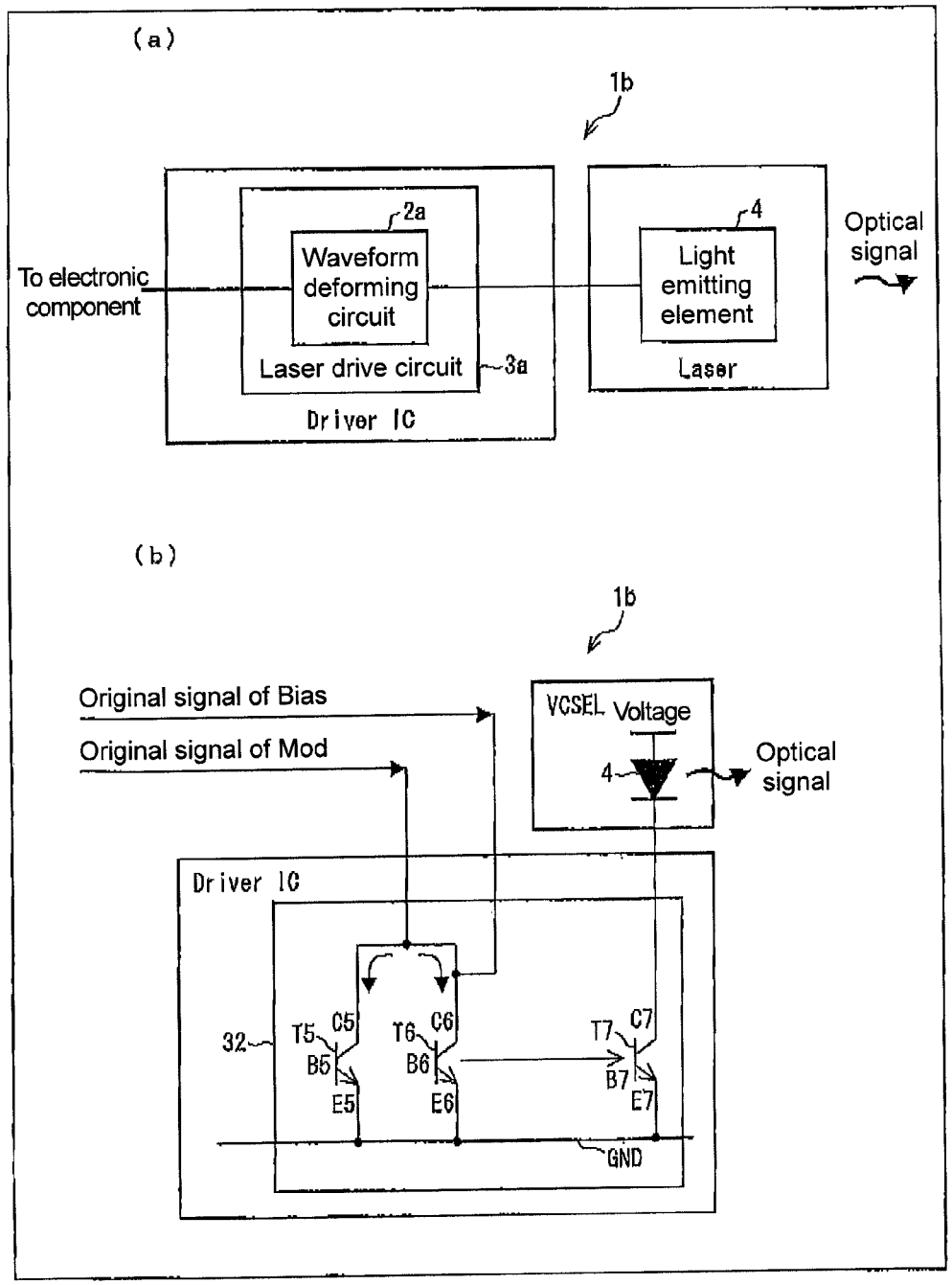
FIGS. 7(a) and (b) are views showing still another embodiment of the present invention, and are a block diagram showing a configuration of the transmission device implemented on the substrate and a view showing a specific circuit configuration of the drive means arranged in the transmission device.

A transmission device according to another embodiment of the present invention will be described using FIG. 7.

FIG. 7(a) is a block diagram showing a configuration of the transmission device according to the present embodiment.

A light transmission device 1b shown in FIG. 7(a) has a configuration in which a waveform deforming circuit 2a is arranged inside a laser drive circuit 3a, which is arranged in place of the laser drive circuit 3, in place of the waveform deforming circuit 2, in the configuration of the light transmission device 1a shown in FIG. 1.

In other words, the binary signal from the electronic component is input to the laser drive circuit 3a of the light transmission device 1b. When the binary signal is input, the laser drive circuit 3a blunts the waveform of the binary signal in the waveform deforming circuit 2a, and outputs the blunted binary signal (waveform deformed signal) to the light emitting element 4. The light emitting element 4 emits light according to the binary signal subjected to processes by the waveform deforming circuit 2a, and transmits the optical signal to the outside.

The light transmission device 1b shown in FIG. 7(a) is implemented with the waveform deforming circuit 2a and the laser drive circuit 3a on the same substrate (reference symbol "Driver IC"), similar to the light transmission device 1a shown in FIG. 6(a). The light emitting element 4 may be implemented on a substrate (see FIG. 7(a), reference symbol "Laser") different from the waveform deforming circuit 2a and the laser drive circuit 3a, or may be implemented on the same substrate as the waveform deforming circuit 2a and the laser drive circuit 3a.

Specifically, the waveform deforming circuit 2a and the laser drive circuit 3a are suitably configured by a circuit shown in FIG. 7(b).

FIG. 7(b) is a view showing a specific circuit configuration of the laser drive circuit 3a arranged in the light transmission device 1b. As shown in FIG. 7(b), description will be made using an example in which the light emitting element 4 as well as the waveform deforming circuit 2a and the laser drive circuit 3a are implemented on substrates different from each other, but the configuration of the transmission device according to the present embodiment is not limited thereto. In other words, the light emitting element 4 may be arranged on the same substrate as the waveform deforming circuit 2a and the laser drive circuit 3a.

The laser drive circuit 32 shown in FIG. 7(b) is used as the laser drive circuit 3a of the light transmission device 1b.

The laser drive circuit 32 shown in FIG. 7(b) is configured to include transistors T5 to T7. A case that the NPN bipolar transistors are used for the transistors T5 to T7, similar to the transistors T1 to T4 of the laser drive circuit 31 shown in FIG. 6(b), will be described.

An emitter E5 of the transistor T5 and an emitter E6 of the transistor T6 are both connected to the ground. A base B6 of the transistor T6 is connected to a base B7 of the transistor T7. The transistor T7 has a collector C7 connected to the substrate (Laser) including the light emitting element 4, and an emitter E7 connected to the ground. The transistor T7 forms a current mirror circuit.

A collector C5 of the transistor T5 is connected to a collector C6 of the transistor T6. The collector C6 of the transistor T6 is connected to a bias current source (not shown), and receives the original signal of the signal of "0" from the bias current source. The collector C5 of the transistor T5 and the collector C6 of the transistor T6 are connected to a modulation current source (not shown), and receives the original signal of the signal of "1" from the modulation current source.

The light transmission device 1b shown in FIG. 7(b) has a configuration in which the bias current source is connected only to the collector C6 of the transistor T6, but is not limited thereto.

In other words, the bias current source may be connected to both the collector C5 of the transistor T5 and the collector C6 of the transistor T6. In this case, the original signal of the signal of "0" is input to both the collector C5 of the transistor T5 and the collector C6 of the transistor T6. According to such configuration, the potential of the collector C5 of the transistor T5 can be prevented from becoming the potential close to the ground level even when the binary signal is the signal of "0". In other words, according to such configuration, the emitter-collector voltage of the transistor T5 always takes a voltage value of greater than or equal to a predetermined value, and thus the current value of the bias current when the current flowing through the collector C5 of the transistor T5 is constant is substantially constant. Thus, the waveform of the binary signal can be more stabilized compared to a case where the bias current source inputs the original signal of the signal of "0" only to the collector C5 of the transistor T5.

When the binary signal is input, the original signal of the signal of "0" continuously flows from the bias current source to the collector C6 of the transistor T6 (or flows to the collector C5 of the transistor T5 and the collector C6 of the transistor T6) in the laser drive circuit 32. The signal of "0" is constant-multiplied by the transistor T7 and flowed to the light emitting element 4.

The signal from the modulation current source, that serves as the original signal of the signal of "1" of the binary signal, flows to the collector C5 of the transistor T5 if the binary signal is the signal of "0", but flows to the transistor T7 through the transistor T6, and then constant-multiplied by the transistor T7 and flowed to the light emitting element 4 if the binary signal is the signal of "1".

The transistor T7 thus switches between a state that only the bias current is input to the light emitting element 4 and a state that the bias current and the modulation current are input to the light emitting element 4. In other words, if the binary signal is the signal of "0", the light emitting element 4 is driven only by the bias current and thus does not output the desired output power. If the binary signal is the signal of "1", the light emitting element 4 is driven by the current in which the modulation current is superimposed on the bias current, and thus outputs the desired output power. The laser drive circuit 32 emits the light emitting element 4 according to the binary signal by switching such two cases based on the binary signal (i.e., direct modulation).

The waveform deforming circuit 2a is configured by the transistor T6 and the transistor T7 of the members configuring the laser drive circuit 32.

When the binary signal is input, the waveform deforming circuit 2a blunts the binary signal by performing the following processes, and outputs the blunted binary signal (waveform deformed signal) to the light emitting element 4. In other words, the signal of "0" and the signal of "1" are respectively constant-multiplied in the transistor T7 and flowed to the light emitting element 4, but parasitic capacitance generates on the collector C7 side of the transistor T7. At the time of the rise of the binary signal, the constant-multiplied current is supplied to the parasitic capacitance, and charges are accumulated in the parasitic capacitance. At the time of the fall of the binary signal, on the other hand, the charges accumulated in the parasitic capacitance have no where to go and thus are gradually discharged to the light emitting element 4. Through the above processes, the waveform of the binary signal becomes blunt at the fall timing. The light emitting element 4 emits light according to the binary signal output from the waveform deforming circuit 2a, and transmits the optical signal to the outside.

Also, according to the above configuration, lower power consumption in the entire transmission device can be expected while suppressing the influence of "Turn on delay".

Conventionally, the laser drive circuit is typically realized with transistor circuits of two stages.

However, the laser drive circuit can be realized with the transistor circuits of one stage according to the above configuration.

Therefore, the light transmission device 1b according to the present embodiment can reduce the power consumption more than or equal to the light transmission device 1a according to the above-described embodiment.

In the present embodiment, the laser drive circuit 32 is configured to include the NPN bipolar transistors as the transistors T5 to T7, but is not limited thereto. In other words, the laser drive circuit 32 may be configured to include a MOS field effect transistor such as CMOS as the transistors T5 to T7. In this case, the laser drive circuit 32 may be configured to use the gate of the MOS field effect transistor in place of the base of the NPN bipolar transistor, the source of the MOS field effect transistor in place of the emitter of the NPN bipolar transistor, and the drain of the MOS field effect transistor in place of the collector of the NPN bipolar transistor in the configuration including the NPN bipolar transistors as the transistors T5 to T7.

Fourth Embodiment

Figure 21:
FIG. 21 is a view showing a relationship of the duty ratio of the signal for performing data communication and the power consumption in the entire electronic device.
Figure 21:
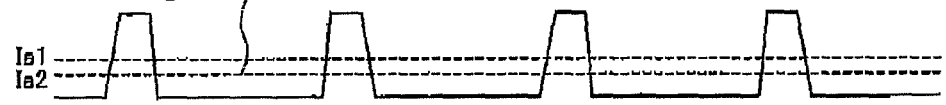

While lower power consumption is strongly demanded on the electronic device in the prior art, the power consumption of the electronic device generally depends on the duty ratio (average level per unit cycle in the binary signal) of the signal for performing data communication. For instance, describing FIG. 21, which shows a relationship of the duty ratio of the signal for performing the data communication and the power consumption in the entire electronic device, by way of example, when the signal which average circuit current at the duty ratio 50% is Ia1 is lowered to the duty ratio 10%, the average circuit current of the signal after the duty ratio is lowered is Ia2, which is lower than Ia1. That is, the average current in the entire electronic device increases the higher the duty ratio of the signal for performing the data communication, and the power consumption in the entire electronic device increases.

However, it is difficult to lower the duty ratio of the signal passing through a plurality of electronic components that performs the data communication in the optical communication network. The reasons will be described below.

In the binary signal, "ISI (Inter-Symbol Interference)" occurs when the duty ratio is lowered. The "ISI" refers to a phenomenon in which the level of the binary signal (in particular, level of the signal of "1") changes due to the interference of the signal of "1" and the signal of "0" of the binary signal. The signal for performing the data communication is a binary signal, as mentioned above. Thus, the "ISI" occurs in the signal when the duty ratio of the signal is lowered. When the "ISI" occurs, incomplete rise and/or incomplete fall occur in the signal, and hence the level of the signal becomes lower than the threshold value (minimum required level of the signal for the data communication), and problems that bring about obstacles in the data communication consequently arise. The problems related to the "ISI" become large problems in the electrical interface (electronic component on the reception side in the electronic device) configuring the electronic device with higher speed of the transmission speed in the data communication.

Thus, in the electronic device, the duty ratio of the signal processed by the plurality of electronic components is man made to about 50% through the coding technique such as 8B10B and Manchester encoding. That is, it is difficult to reduce the duty ratio of the signal passing through the plurality of electronic components and reduce the power consumption caused by such signal.

A technique of dropping the duty ratio of the signal passing the light transmission module is considered for a technique of reducing the power consumption in the entire electronic device. With this, the duty ratio of the signal for performing the data communication can be lowered in the transmission path of the light transmission module, and hence the power consumed in the light transmission module can be reduced. The power consumed in the entire electronic device thus can be consequently reduced.

A configuration of dropping the duty ratio of the signal for performing the data communication in the light transmission device and raising the duty ratio of the signal in the light reception device is considered as a configuration for implementing the above technique. This type of configuration includes a configuration of holding the signal for performing the data communication with a memory and the like, and expanding the held signal in the time axis direction using the CDR (Clock Data Recovery), the PLL (Phase Locked Loop), or the like.

However, the power consumed by the memory, and the CDR or the PLL is very large in the above-described configuration. Thus, the power consumption increases on the light reception device side and the power consumption in the light transmission module increases. The power consumption in the entire electronic device consequently increases.

The original purpose of dropping the duty ratio of the signal that passes the light transmission module is to reduce the power consumption in the entire electronic device. Therefore, when implementing the above technique, a configuration capable of dropping the duty ratio of the signal that passes the light transmission module by lower power consumption is desired. The application of the above-described configuration to implement the above technique is thus not suitable.

In the present embodiment, a transmission device, capable of reducing the circuit scale and ensuring the degree of freedom in the design of the electronic device, and capable of suppressing increase in the manufacturing cost will be described. The transmission device will be described below using FIG. 8 and FIG. 9.

Figure 8:
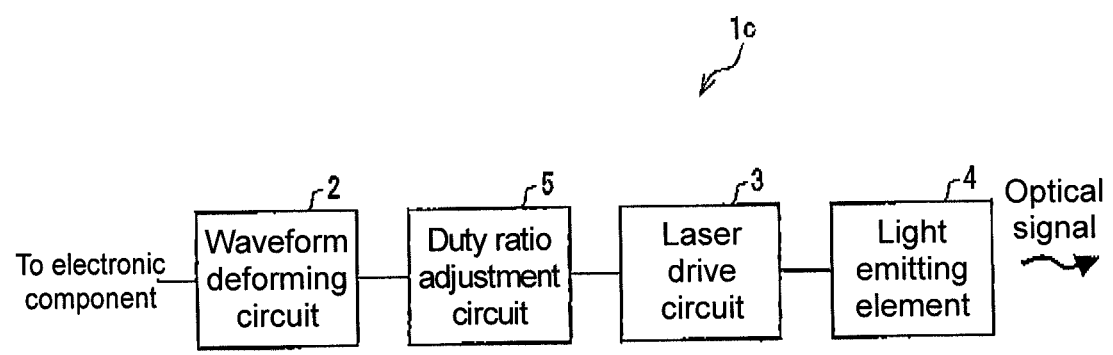
FIG. 8 is a view showing still another embodiment of the present invention, and is a block diagram showing a configuration of the transmission device.
Figure 9:
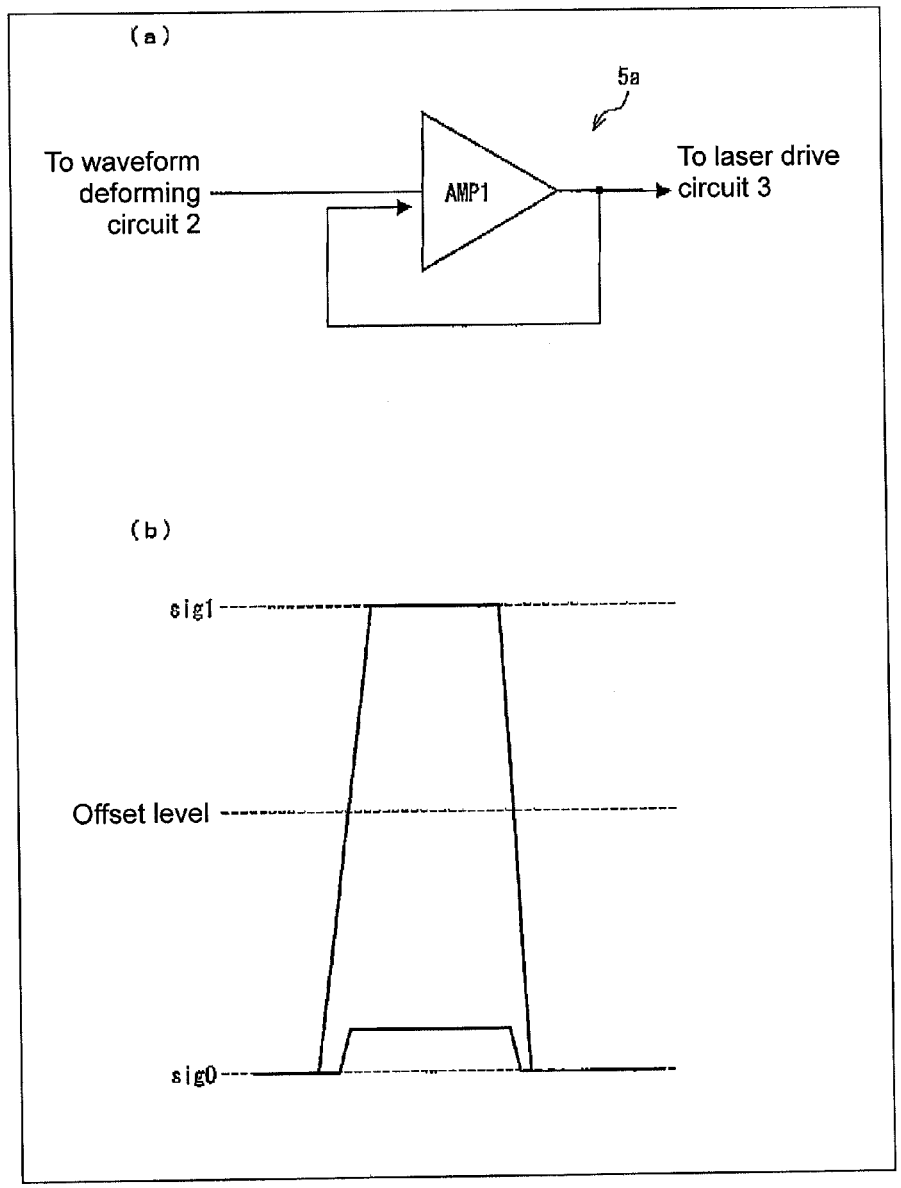
FIGS. 9(a) and 9(b) are a view showing a circuit configuration example of a duty ratio adjustment means according to one or more embodiments of the present invention and a view showing the principle of lowering the duty ratio of the binary signal with the duty ratio adjustment means.

FIG. 8 is a block diagram showing a configuration of the transmission device according to the present embodiment.

The transmission device 1c shown in FIG. 8 has a configuration of further including a duty ratio adjustment circuit 5 at the post-stage of the waveform deforming circuit 2 and the pre-stage of the laser drive circuit 3 in the configuration of the light transmission device 1a shown in FIG. 1.

The duty ratio adjustment circuit 5 adjusts the duty ratio of the received binary signal. Specifically, the duty ratio adjustment circuit 5 performs a process of lowering the duty ratio by shortening the period of the signal of "1" of the binary signal.

FIG. 9(a) is a view showing a circuit configuration example of the duty ratio adjustment means according to one or more embodiments of the present invention.

The duty ratio adjustment circuit 5 is a duty ratio adjustment circuit 5a including a feedback amplifier AMP1 having the feedback function, shown in FIG. 9(a), for example.

FIG. 9(b) is a view showing the principle of lowering the duty ratio of the binary signal with the duty ratio adjustment means.

The feedback amplifier AMP1 serving as the duty ratio adjustment circuit 5a can adjust the duty ratio of the binary signal by offsetting the binary signal at a predetermined level ("offset level" shown in FIG. 9(b)), as shown in FIG. 9(b). The "offset level" corresponds to the offset voltage according to one or more embodiments of the present invention. The duty ratio of the binary signal can also be controlled by appropriately adjusting the value of the "offset level".

In the analog amplifier such as the feedback amplifier AMP1, the duty ratio is basically set to 50% while eliminating the "offset level" with the AOC (Auto Offset Control) and the like as well known. In the present embodiment, however, the pulse width of the binary signal can be controlled by appropriately setting the voltage that serves as one reference in the difference in the feedback amplifier AMP1.

According to the above configuration, further reduction of the power consumption can be realized since the duty ratio of the binary signal can be lowered to the desired value.

In the present embodiment, the feedback amplifier AMP1 having a feedback function is used for the duty ratio adjustment circuit 5a, but is merely one example of the duty ratio adjustment circuit 5, and the configuration of the duty ratio adjustment circuit 5 is not limited thereto.

In other words, the duty ratio adjustment circuit 5 may have a configuration of performing the offset of the binary signal using a transistor having a threshold value corresponding to the "offset level" (i.e., current value it conducts). The duty ratio adjustment circuit 5 may be an inverter in which the threshold value is set to the "offset level". That is, the duty ratio adjustment circuit 5 is not particularly limited as long as it has a configuration of controlling the duty ratio of the binary signal by controlling the DC component in the binary signal based on the "offset level" set to itself (or it has) or a certain threshold value. In particular, the process of shortening the period of the signal of "1" of the binary signal can be easily performed by using the transistor for the duty ratio adjustment circuit 5.

Furthermore, in the present embodiment, the duty ratio adjustment circuit 5 is arranged at the post-stage of the waveform deforming circuit 2 and the pre-stage of the laser drive circuit 3. However, the portion where the duty ratio adjustment circuit 5 is arranged is not limited thereto. In other words, the duty ratio adjustment circuit 5 may be configured to be arranged at the pre-stage of the waveform deforming circuit 2, or may be configured to be arranged at the post-stage of the laser drive circuit 3 and the pre-stage of the light emitting element 4.

Furthermore, in the present embodiment, the duty ratio adjustment circuit 5 is arranged in the light transmission device 1a shown in FIG. 1, but is not limited thereto. In other words, the duty ratio adjustment circuit 5 may be arranged in the light transmission device 1b shown in FIG. 7(a). The configuration where the duty ratio adjustment circuit 5 is arranged in the light transmission device 1b may be a configuration in which the duty ratio adjustment circuit 5 is further arranged in the light transmission device 1b, or a configuration in which the transistor T7 of the light transmission device 1b have the function of the duty ratio adjustment circuit 5 with the circuit configuration itself as is.

Fifth Embodiment

A reception device according to one embodiment of the present invention will be described using FIG. 10 and FIG. 11.

Figure 10:
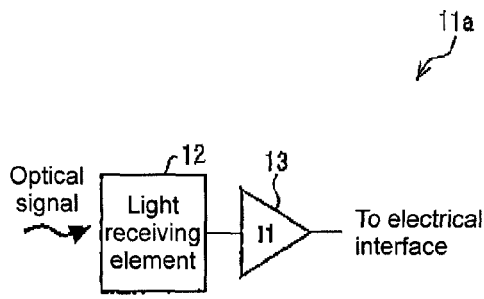
FIG. 10 is a view showing one embodiment of the present invention, and is a block diagram showing a configuration of a reception device.

FIG. 10 is a block diagram showing a configuration of a reception device according to the present embodiment.

The light reception device (reception device) 11a shown in FIG. 10 has a configuration including a light receiving element 12, and a waveform shaping circuit (waveform shaping means) 13.

The light reception device 11a shown in FIG. 10, as well as, the light reception device 11b (see FIG. 12), the light reception device 11c (see FIG. 14), and the light reception device 11d (see FIG. 15) to be hereinafter described are connected to the electrical interface (not shown) at the post-stage, and provides the binary signal (signal for performing data communication) including the signal of "1" and the signal of "0" to the electrical interface.

The light receiving element 12 receives the binary signal as an optical signal, converts the optical signal to an electric signal, and outputs the same to the waveform shaping circuit 13. A photodiode, a CCD (Charge Coupled Devices), a CMOS image sensor, and the like are examples of an element used as the light receiving element 12.

The waveform shaping circuit 13 compares the level of the binary signal from the light receiving element 12 with a predetermined threshold value to perform the shaping process of the binary signal in which distortion and/or blunt is occurring in the waveform. In the shaping process, Tr and Tf may both be a time of an extent enabling transmission. The process of extending the period of the signal of "1" of the binary signal can be further performed in the waveform shaping circuit 13.

In the light reception device 11a shown in FIG. 10, the inverter I1 is used for the waveform shaping circuit 13. The inverter I1 is a digital amplification circuit that outputs the signal of "0" if the level of the received binary signal is a value greater than or equal to a predetermined threshold value, and outputs the signal of "1" if the level is a value smaller than the predetermined threshold value.

The inverter I1 can easily perform the shaping process of the binary signal by sufficiently enhancing its response speed. The extent the inverter I1 raises the duty ratio of the binary signal can be easily set by appropriately using the inverter having the predetermined threshold value.

The shaping process of the waveform shaping circuit 13 with respect to the binary signal will be described using FIGS.

11(*a*) and 11(*b*). In the shaping process, the process of extending the period of the signal of "1" of the binary signal may be obviously omitted. A specific processing method of the shaping process is not particularly limited.

Figure 11:
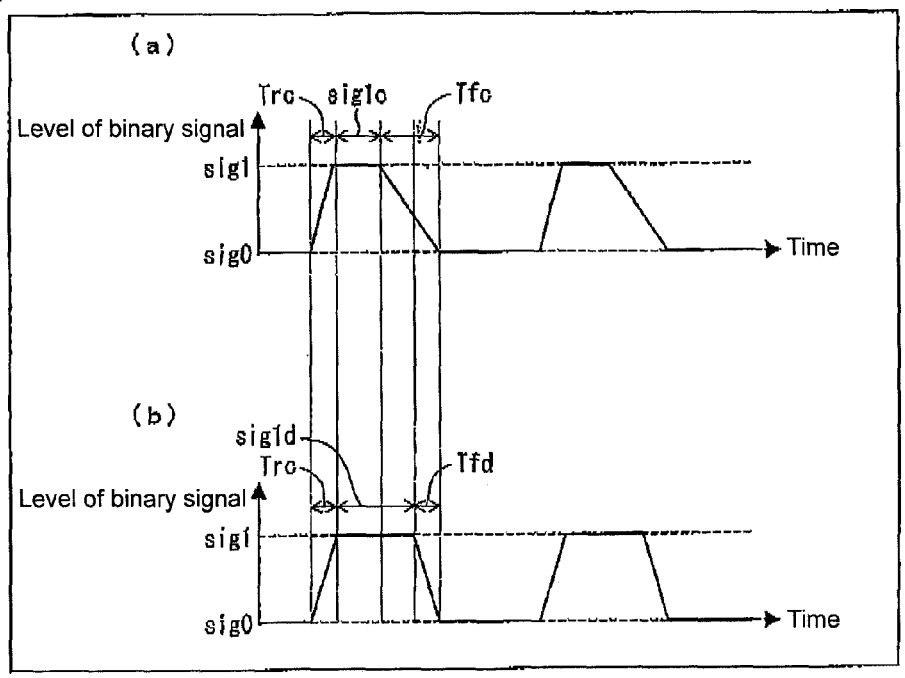
FIGS. 11(a) and 11(b) are a graph showing the waveform of the binary signal before being input to a waveform shaping circuit according to one or more embodiments of the present invention, and a view showing the waveform of the binary signal output from the waveform shaping circuit.

FIG. 11(*a*) is a graph showing the waveform of the binary signal before being input to the waveform shaping circuit 13. FIG. 11(*b*) is a view showing the waveform of the binary signal output from the waveform shaping circuit 13. In each graph of FIGS. 11(*a*) and 11(*b*), the vertical axis indicates the level of the binary signal and the horizontal axis indicates the time (period of the signal of "1" and the period of the signal of "0" in the binary signal).

Blunt is occurring in the binary signal shown in FIG. 11(*a*). In this case, the binary signal shown in FIG. 11(*a*) has a time required for the fall, Tfc, and the period of the signal of "1", sig1c. Tfc is longer than the time Trc required for the rise.

When the binary signal shown in FIG. 11(*a*) is input to the waveform shaping circuit 13, the waveform shaping circuit 13 shapes the binary signal, in which the Tf is long, by comparing the level of the binary signal and the predetermined threshold value with the inverter I1.

As a result, the binary signal shown in FIG. 11(*a*) is deformed to the binary signal shown in FIG. 11(*b*) by the waveform shaping circuit 13, and output to the electrical interface. The binary signal shown in FIG. 11(*b*) has the time Tfd required for the fall shorter than the Tfc and substantially equal to the Trc. The binary signal shown in FIG. 11(*b*) also has the period of the signal of "1", sig1d, which is longer than sig1c.

In the light reception device 11*a* shown in FIG. 10, an odd number of inverters (one inverter I1) is arranged as the waveform shaping circuit 13. In this case, the binary signal input to the light reception device 11*a* is subjected to logical inversion simultaneously with the shaping in the waveform shaping circuit 13, and provided to the electrical interface of poststage. In the light reception device 11*a*, if an inverter (not shown) is further arranged in odd numbers between the light receiving element 12 and the electrical interface, that is, if the inverter is arranged in even numbers between the light receiving element 12 and the electrical interface, it can be easily recognized by those skilled in the art that the logical inversion is not performed.

The binary signal shown in FIG. 11(*b*) has a higher duty ratio than the binary signal shown in FIG. 11(*a*). The waveform shaping circuit 13 provides the binary signal of high duty ratio to the electrical interface, and thus "ISI" does not occur in the binary signal in the electrical interface.

The light reception device 11*a* has a configuration of raising the duty ratio of the binary signal with one circuit element (inverter I1). Thus, the light reception device 11*a* can reduce the power consumption compared to the configuration of holding the signal for performing the data communication with a memory, and the like, and expanding the held signal in the time axis direction using the CDR, PLL, and the like to raise the duty ratio.

Sixth Embodiment

A reception device according to another embodiment of the present invention will be described using FIG. 12 and FIG. 13.

Figure 12:
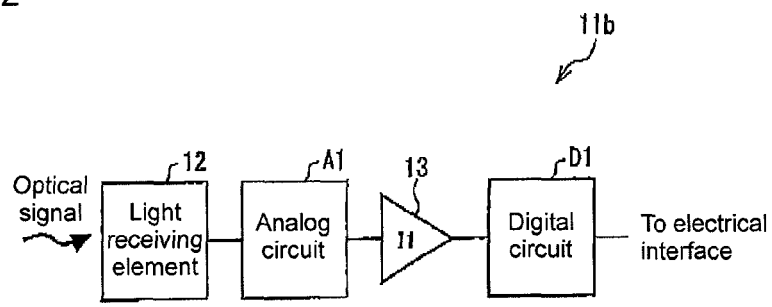
FIG. 12 is a view showing another embodiment of the present invention, and is a block diagram showing a configuration of the reception device.

FIG. 12 is a block diagram showing a configuration of the reception device according to the present embodiment.

The light reception device 11*b* shown in FIG. 12 has a configuration in which an analog circuit A1 that handles an analog signal is arranged at the post-stage of the light receiving element 12 and the pre-stage of the waveform shaping circuit 13, and a digital circuit D1 that handles a digital signal is arranged at the post-stage of the waveform shaping circuit 13 and the pre-stage of the electrical interface in the configuration of the light reception device 11*a* shown in FIG. 10. In other words, the waveform shaping circuit 13 is arranged at the connecting portion of the analog circuit A1 and the digital circuit D1. The analog circuit A1 may include an amplifier (not shown) for amplifying the binary signal from the light receiving element 12. The waveform shaping circuit 13 may be arranged as one part of the digital circuit D1 as long as it is arranged at the connecting portion of the analog circuit A1 and the digital circuit D1.

The inverter arranged in the waveform shaping circuit according to one or more embodiments of the present invention changes the gain according to the size of the transistor (not shown) with which it is configured. The shaping level of the waveform of ht signal that passes the inverter changes according to a circuit (level determination circuit (not shown)) for adjusting the threshold value of the inverter and the level of the input signal. That is, the level of the signal after the waveform shaping by the inverter is performed is determined by the threshold of the inverter, the gain of the inverter, and the level of the input signal.

If a capacitor is connected (so-called capacity coupling) to a boundary (i.e., for example, the above-described connecting portion) of the analog circuit A1 and the digital circuit D1 in the reception device according to the present embodiment, the DC level of the signal flowing from the analog circuit A1 to the digital circuit D1 becomes a ground level. The level of the signal after the waveform shaping by the inverter is performed is determined by the threshold value of the inverter and the gain of the inverter. That is, the DC level of the signal output from the inverter is controlled according to only the characteristics of the inverter. Therefore, the DC level of the signal output from the inverter can be easily controlled in this case.

The light receiving element 12 receives the binary signal in which distortion and/or blunt is occurring in the waveform as the optical signal, converts the optical signal to an electric signal, and outputs the same to the analog circuit A1.

The analog circuit A1 amplifies the binary signal from the light receiving element 12 (i.e., analog process the binary signal), and outputs to the waveform shaping circuit 13.

The waveform shaping circuit 13 performs the shaping process on the binary signal from the analog circuit A1, and outputs to the electrical interface through the digital circuit D1.

The waveform shaping circuit according to the present embodiment uses the waveform shaping circuit 13 having the inverter I1, similar to the embodiment shown in FIG. 10. However, the configuration of the waveform shaping circuit according to the present embodiment is not limited thereto, and a buffer may be used or a comparator may be used for the waveform shaping circuit. In other words, the waveform shaping circuit according to the present embodiment is not particularly limited as long as it has a configuration of including a circuit element capable of amplifying the digital signal (digitally amplify the binary signal from the analog circuit A1). This is the same in the waveform shaping circuit 13 in FIG. 10 and the waveform shaping circuit 14 in FIG. 14. That is, the waveform shaping circuit 13 and the waveform shaping circuit 14 according to one or more embodiments of the present invention both are not limited to the configuration of including one or a plurality of inverters, and may have a configuration of including a circuit element capable of amplifying one or a plurality of digital signals.

According to the above configuration, the light reception device 11b outputs the binary signal with high duty ratio to the electrical interface, and thus the "ISI" does not occur in the binary signal in the electrical interface.

According to the above configuration, the light reception device 11b can reduce the power consumption compared to the configuration of holding the signal for performing the data communication with a memory, and extending the held signal in the time axis direction using the CDR, the PLL, and the like to raise the duty ratio.

Furthermore, according to the above configuration, the distortion of the waveform of the binary signal does not need to be taken into consideration when amplifying the binary signal with the amplifier of the analog circuit A1. Thus, the consumption current can be greatly reduced, and the power consumption in the analog circuit A1 can be greatly reduced.

Moreover, according to the above configuration, the waveform shaping circuit 13 shapes the binary signal through the shaping process described above, but the signal processing by the digital circuit D1 can be performed since the binary signal subjected to the shaping process has the distortion of the waveform greatly reduced. The digital circuit D1 generally has lower drive voltage compared to the analog circuit A1. Thus, the light reception device 11b can further reduce the power consumption by realizing the circuit at the post-stage of the waveform shaping circuit 13 with the digital circuit D1.

The digital circuit D1 suitably has high speed response than the analog circuit A1, that is, the digital circuit D1 is suitably driven at higher speed than the analog circuit A1. The wire width of the wiring of the digital circuit D1 is made narrower than the wire width of the wiring of the analog circuit A1 in order to drive the digital circuit D1 at higher speed than the analog circuit A1.

According to the above configuration, the shaping process of the binary signal by the waveform shaping circuit 13 can be easily carried out.

The reception device according to one or more embodiments of the present invention includes the analog circuit A1 for receiving the analog signal and handling the received signal, and the digital circuit D1 for handling the digital signal to be transmitted to the outside, where the analog circuit A1 is driven at a current value lower than the current value at which it can be stably driven.

Specific examples will be described using FIG. 13.

Figure 13:
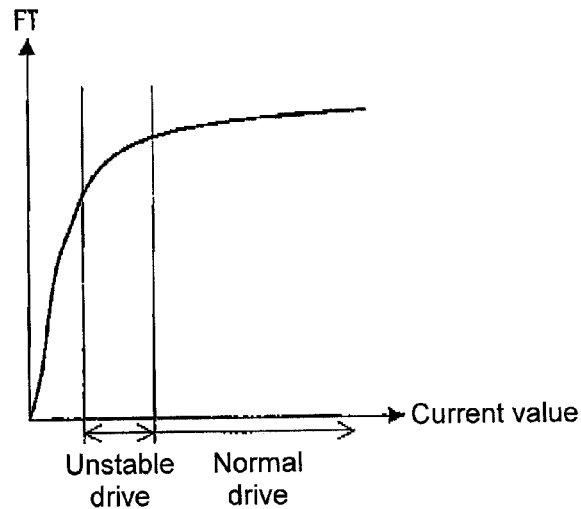
FIG. 13 is a graph showing a relationship between a drive current value of a analog circuit and a drive status of the analog circuit.

FIG. 13 is a graph showing a relationship between the drive current value of the analog circuit and the drive status of the analog circuit.

As shown in the graph of FIG. 13, the current value (current value corresponding to "normal drive" in the graph of FIG. 13) at which it can be stably driven sufficiently is determined in the analog circuit A1.

However, in the reception device according to one or more embodiments of the present invention, the analog circuit A1 is driven at the current value (current value corresponding to "unstable drive" in the graph of FIG. 13) smaller than or equal to the "normal drive". The power consumption itself thus can be reduced. The reception device is suitably used in a device in which it is difficult to drive the analog circuit A1 at the current value corresponding to the "normal drive".

Seventh Embodiment

A reception device according to another embodiment of the present invention will be described using FIG. 14.

Figure 14:
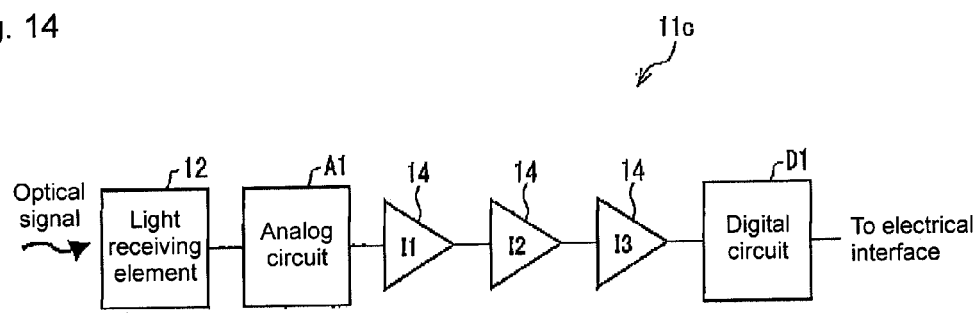
FIG. 14 is a view showing still another embodiment of the present invention, and is a block diagram showing a configuration of the reception device.

FIG. 14 is a block diagram showing a configuration of the reception device according to the present embodiment.

The light reception device 11c shown in FIG. 14 has a configuration in which a waveform shaping circuit 14 is arranged in place of the waveform shaping circuit 13 in the configuration of the light reception device 11b shown in FIG. 12.

The waveform shaping circuit 14 has a configuration of including a plurality of inverters (inverters I1 to I3).

In other words, the waveform shaping circuit 14 performs the shaping process of the binary signal for every plurality of inverters.

Therefore, the light reception device 11c can more accurately perform the shaping process of the binary signal. The circuit scale and the degree of freedom in the design of the light transmission device 11c can be appropriately set according to the number of inverters, that is, the extent of accuracy of the shaping process of the binary signal.

In the present embodiment, the waveform shaping circuit 14 has a configuration of including three inverters I1 to I3, but is not limited thereto. In other words, the waveform shaping circuit 14 may include two inverters, or may include four or more inverters. The waveform shaping circuit 14 can appropriately control the amplification degree of the binary signal according to the number of plurality of inverters.

Furthermore, in the present embodiment, the waveform shaping circuit 14 is configured by an inverter, but is not limited thereto, and the configuration is not limited as long as it is configured by a circuit element capable of amplifying the digital signal.

Eighth Embodiment

A reception device according to another embodiment of the present invention will be described using FIG. 15.

Figure 15:
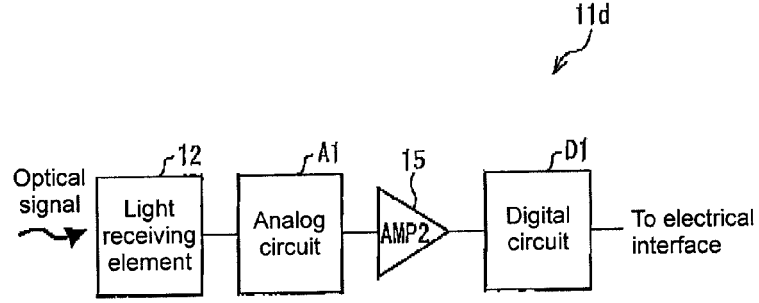
FIG. 15 is a view showing still another embodiment of the present invention, and is a block diagram showing a configuration of the reception device.
Figure 16:
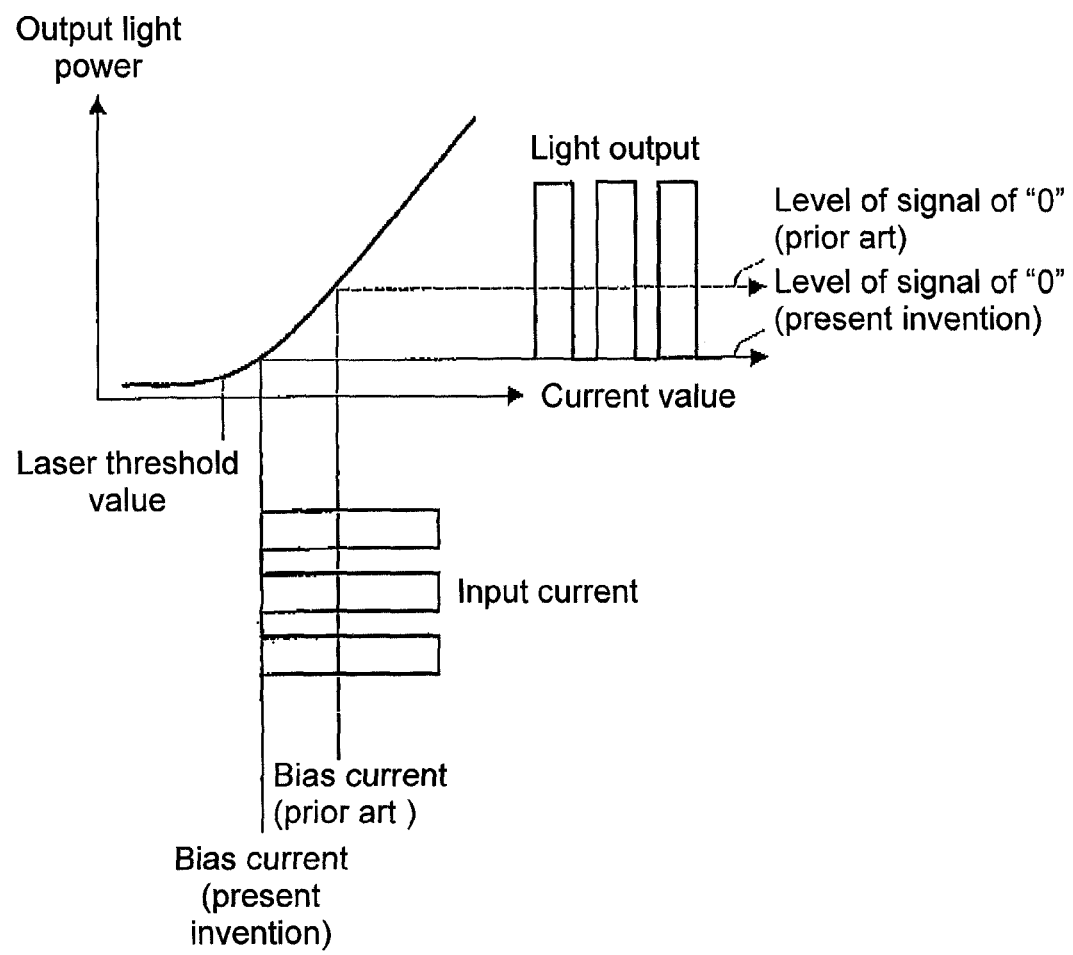
FIG. 16 is a graph describing the effects of the transmission device of one embodiment of the present invention.

FIG. 15 is a block diagram showing a configuration of the reception device according to the present embodiment.

The light reception device 11d shown in FIG. 15 has a configuration in which a waveform shaping circuit 15 is arranged in place of the waveform shaping circuit 13 in the configuration of the light reception device 11b shown in FIG. 12.

The waveform shaping circuit 15 is configured to include an amplifier AMP2. The amplifier AMP2 is set with a sufficiently large signal gain. The waveform shaping circuit 15 may be arranged as one part of the analog circuit A1 as long it is arranged at the connecting portion of the analog circuit A1 and the digital circuit D1. The waveform shaping circuit 15 differs from the waveform shaping circuit 13 regarding such aspect.

When the binary signal in which distortion and/or blunt is occurring in the waveform is input, the amplifier AMP2 amplifies the binary signal to raise the duty ratio of the binary signal. The amplifier AMP2 performs a process of having the Tr and the Tf of the binary signal the same time with respect to each other.

According to the above configuration, the light reception device 11d is configured to raise the duty ratio of the binary signal by the amplifier (amplifier AMP2). Thus, the light reception device 11d can reduce the power consumption compared to the configuration of holding the signal for performing the data communication with a memory, and extending the held signal in the time axis direction using the CDR, the PLL, and the like to raise the duty ratio.

In the present embodiment, a configuration in which the waveform shaping circuit 15 includes one amplifier has been described, but this is not the sole case. In other words, the waveform shaping circuit 15 may be configured to include two or more amplifiers having substantially the same property as the amplifier AMP2. The waveform shaping circuit 15 may be configured to further include a circuit element (e.g., inverter I1) capable of amplifying one or a plurality of digital signals used in the waveform shaping circuit 13.

Furthermore, in the present embodiment, an LIA (Limiting Amplifier) may be arranged as the amplifier AMP2 of the waveform shaping circuit 15. In other words, the waveform shaping circuit 15 may be configured to amplify the signal of "1" of the binary signal to a predetermined level (level of the signal of "1" of the binary signal suited for the electrical interface) by the LIA when the binary signal is input. When adopting the configuration including the LIA as the amplifier AMP2 of the waveform shaping circuit 15, the waveform shaping circuit 15 may be configured to include only one LIA or may be configured to include two or more LIAs.

The analog circuit A1 may be driven by the current value of smaller than or equal to the current value at which it can be stably driven.

Ninth Embodiment

Figure 22:
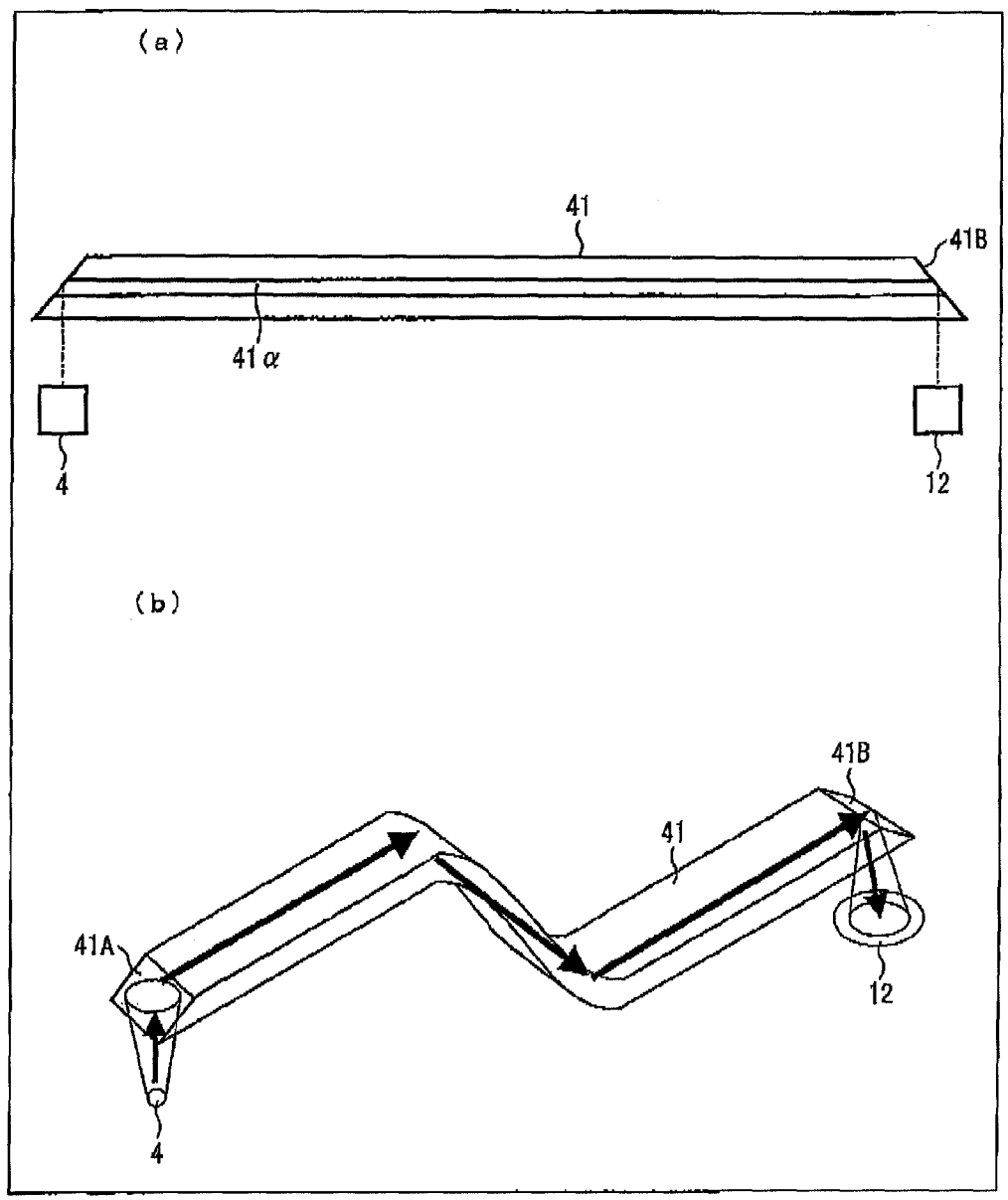
FIGS. 22(a) and 22(b) are a side view of the light guide, and a view schematically showing the state of light transmission in the light guide.
Figure 23:
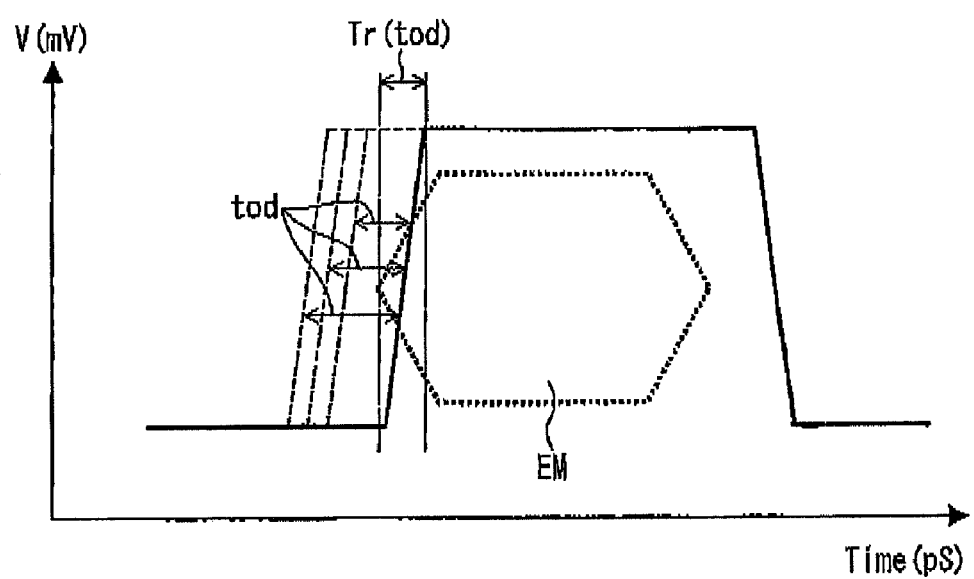
FIG. 23 is a view showing a concept of Turn on delay.

The transmission device and the reception device according to another embodiment of the present invention will be described using FIG. 17 and FIG. 22.

FIG. 17(a) is a view showing an example of a case of transmitting the optical signal to the outside by the transmission device according to one or more embodiments of the present invention, and a case of receiving the optical signal from the outside by the reception device according to one or more embodiments of the present invention.

The light transmission device 1 shown in FIG. 17(a) is connected with the light reception device 11 by the light guide (transmission medium) 41.

The light transmission device 1 has the electronic component (not shown) connected at the pre-stage, and receives the binary signal (signal for performing data communication) including the signal of "1" and the signal of "0" from the electronic component. The light transmission device 11 has the electrical interface (not shown) connected at the post-stage, and outputs the binary signal to the electrical interface.

The light guide 41 described below may be used. One example of the light guide 41 will be described using FIGS. 22(a) and 22(b).

FIG. 22(a) shows a side view of the light guide 41. As shown in the figure, the light guide 41 is configured to include a column-shaped core 41α centering on the light transmitting direction, and a clad 41B surrounding the periphery of the core 41α. The core 41α and the clad 41B are made of a material having translucency, where the index of refraction of the core 41α is higher than the index of refraction of the clad 41B. Thus, the optical signal that has entered the core 41α is transmitted in the light transmitting direction while repeating total reflection at the interior of the core 41α.

The material constituting the core 41α and the clad 41B may be glass, plastic, and the like, but is preferably, for example, an acryl, epoxy, urethane, and silicone resin materials to constitute the light guide 41 having sufficient flexibility. The clad 41B may be constituted by gas such as air. Furthermore, similar effects can be obtained even if the clad 41B is used under an atmosphere of liquid having a smaller index of refraction than the core 41α.

The mechanism of the light transmission by the light guide 41 will now be described using FIG. 22(b). FIG. 22(b) schematically shows the state of light transmission in the light guide 41. As shown in the figure, the light guide 41 is configured by a column-shaped member having flexibility. The light incident surface 41A is arranged at the light incident side end of the light guide 41, and the light exit surface 41B is arranged at the light exit side end.

The light exited from the light emitting element 4 enters the light incident side end of the light guide 41 from a direction perpendicular to or substantially perpendicular to the light transmitting direction of the light guide 41. The entered light is introduced into the light guide 41 by being reflected at the light incident surface 41A, and advances through the core 14α. The light advanced through the light guide 41 and reached the light exit side end is reflected at the light exit surface 41B, and is output in the direction perpendicular to or substantially perpendicular to the light transmitting direction of the light guide 41. The light receiving element 12 is irradiated with the exited light, and photoelectric conversion is performed in the light receiving element 12.

According to such configuration, the light emitting element 4 serving as the light source is arranged in the direction perpendicular to or substantially perpendicular to the light transmitting direction of the light guide 41. Thus, when the light guide 41 needs to be arranged parallel to the substrate surface, the light emitting element 4 is to be installed between the light guide 41 and the substrate surface so as to exit the light in the normal direction of the substrate surface. Such configuration facilitates mounting and is more compact in configuration than the configuration of installing the light emitting element 4 so as to exit the light parallel to the substrate surface. This is because the general configuration of the light emitting element 4 is such that the size in the direction perpendicular to the direction of exiting the light is greater than the size in the direction of exiting the light. Furthermore, application can also be made to a configuration of using a planar mounting light emitting element in which the electrode and the light emitting element 4 are arranged in the same plane.

However, the configuration of the light guide 41 is not limited to the above configuration, and a well-known light guide may be used.

The light transmission device 1 transmits the binary signal to the outside with distortion and blunt occurred in the binary signal. The light transmission device 1 suitably has a configuration of including any one of the light transmission devices 1a to 1c, but is not limited thereto. In other words, the light transmission device 1 may be any transmission device as long as it is a transmission device capable of transmitting the binary signal to the outside with the Tr and the Tf of the binary signal being different times from each other.

The light reception device 11 receives the binary signal in which distortion and/or blunt occurred in the waveform from the outside, and performs a process of having the Tr and the Tf of the binary signal the same time with respect to each other. The Tr and the Tf are aligned to the time of shorter one in the process of having the Tr and the Tf the same time with respect to each other. The light reception device 11 suitably has a configuration of any one of the light reception devices 11a to 11c, but is not limited thereto. In other words, the light reception device 11 may be any reception device as long as it is a reception device capable of receiving the binary signal in which the Tr and the Tf are different times from each other and performing a process of having the Tr and the Tf of the binary signal the same time with respect to each other.

Figure 17:
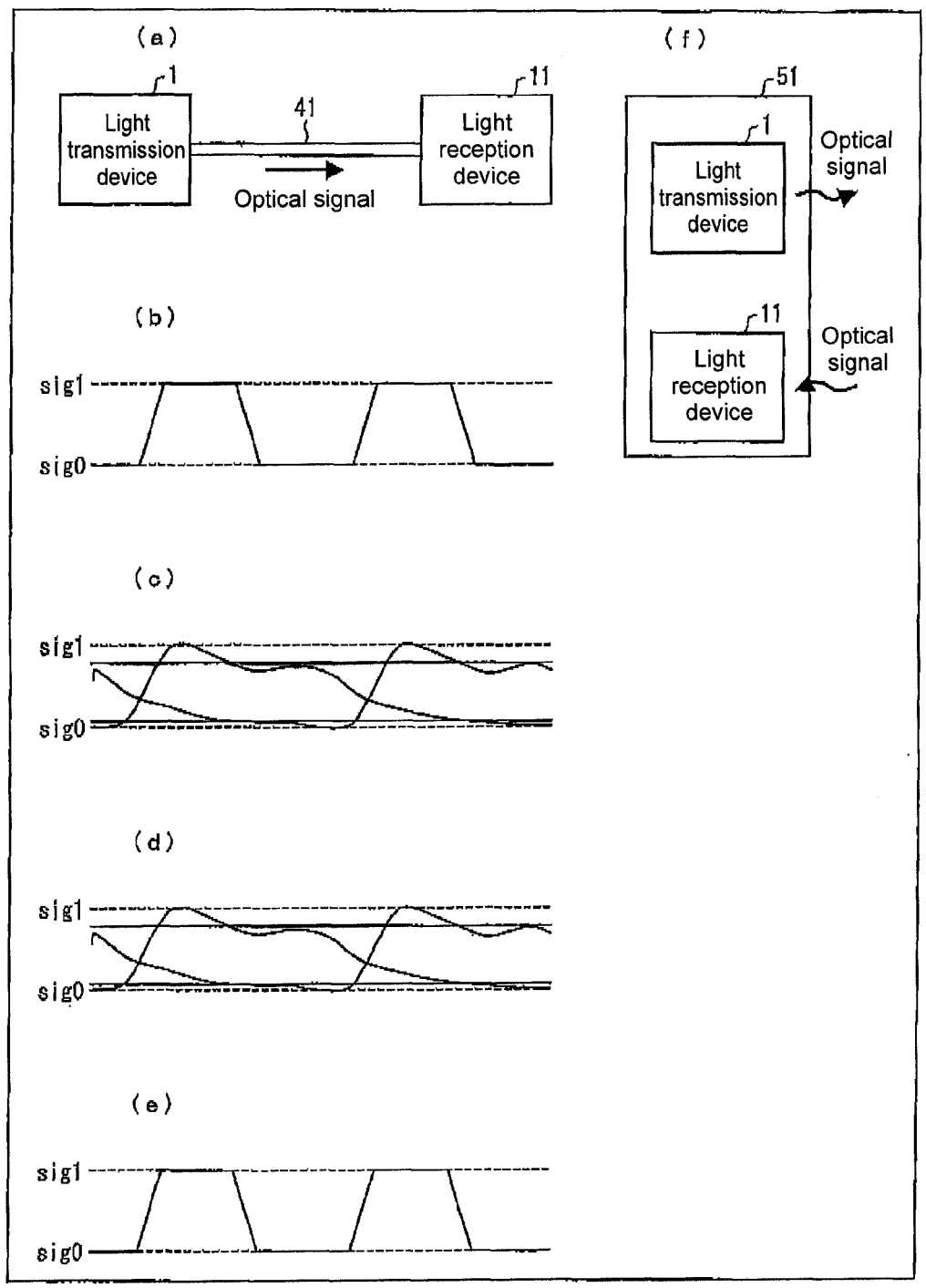
FIGS. 17(a) to 17(f) are diagrams showing one embodiment of the present invention.

FIG. 17(b) is a diagram showing a waveform of the binary signal input to the transmission device according to one or more embodiments of the present invention from the electronic component. FIG. 17(c) is a diagram showing a waveform of the binary signal transmitted to the outside by the transmission device according to one or more embodiments of the present invention. FIG. 17(*d*) is a diagram showing another waveform of the binary signal transmitted to the outside by the transmission device according to one or more embodiments of the present invention. FIG. 17(*e*) is a diagram showing a waveform of the binary signal output by the reception device according to one or more embodiments of the present invention.

The binary signal from the electronic component (see FIG. 17(*b*) for waveform) is input to the light transmission device 1.

The light transmission device 1 generates distortion in the binary signal from the electronic component (see FIG. 17(*c*) for waveform), and transmits the binary signal to the outside by the light guide 41.

The distortion in the waveform of the binary signal generated in the light transmission device 1 may occur from structural features of the transmission device according to one or more embodiments of the present invention such as matching failure, or may occur as a result of performing the process of distorting the waveform of the binary signal by the light transmission device 1.

The light transmission device 1 may transmit the binary signal to the outside by the light guide 41 with the blunt occurred (see FIG. 17(*d*) for waveform). The blunt in the waveform of the binary signal generated in the light transmission device 1 may occur from structural features of the transmission device according to one or more embodiments of the present invention such as matching failure, or may occur as a result of performing the process of blunting the waveform of the binary signal by the light transmission device 1.

In the light transmission device 1, the distortion and/or blunt of the waveform of the binary signal does not need to be reduced. Thus, a circuit for reducing the distortion and/or blunt does not need to be inserted in the light transmission device 1, and hence the power consumption can be suppressed. Furthermore, strict designing and manufacturing do not need to be performed in the light transmission device 1, and hence the degree of freedom in designing can be ensured and the increase in the manufacturing cost can be suppressed.

The light reception device 11 receives the binary signal, in which distortion and/or blunt is occurring, from the outside (i.e., light guide 41). The light reception device 11 performs a process of having the Tr and the Tf of the binary signal the same time with respect to each other (see FIG. 17(*e*) for waveform), and outputs the binary signal to the electrical interface.

According to the above configuration, the light reception device 11 can reduce the power consumption compared to the configuration of holding the signal for performing the data communication with a memory, and the like, and expanding the held signal in the time axis direction using the CDR, PLL, and the like to raise the duty ratio.

In the present embodiment, the light guide is used for the transmission medium, but is not limited thereto. In other words, an optical fiber may be used for the transmission medium in the present embodiment.

In the present embodiment, the transmission device and the reception device are connected to each other by the transmission medium and transmit the binary signal through the transmission medium, but are not limited thereto.

In other words, the transmission device according to one or more embodiments of the present invention may be used as a light transmission device (hereinafter referred to as light transmission module) including the transmission device (or the transmission device and the transmission medium), and the reception device according to one or more embodiments of the present invention may be used as a light reception device (hereinafter referred to as light reception module) including the reception device (or the reception device and the transmission medium).

Furthermore, the transmission device and the reception device according to one or more embodiments of the present invention may be used as a transmission and reception device 51, including both the light transmission device 1 and the light reception device 11, for transmitting and receiving the binary signal, as shown in FIG. 17(*f*).

Tenth Embodiment

The light transmission module including the transmission device and/or the reception device according to one or more embodiments of the present invention described in the above embodiments will be described using FIG. 18.

Figure 18:
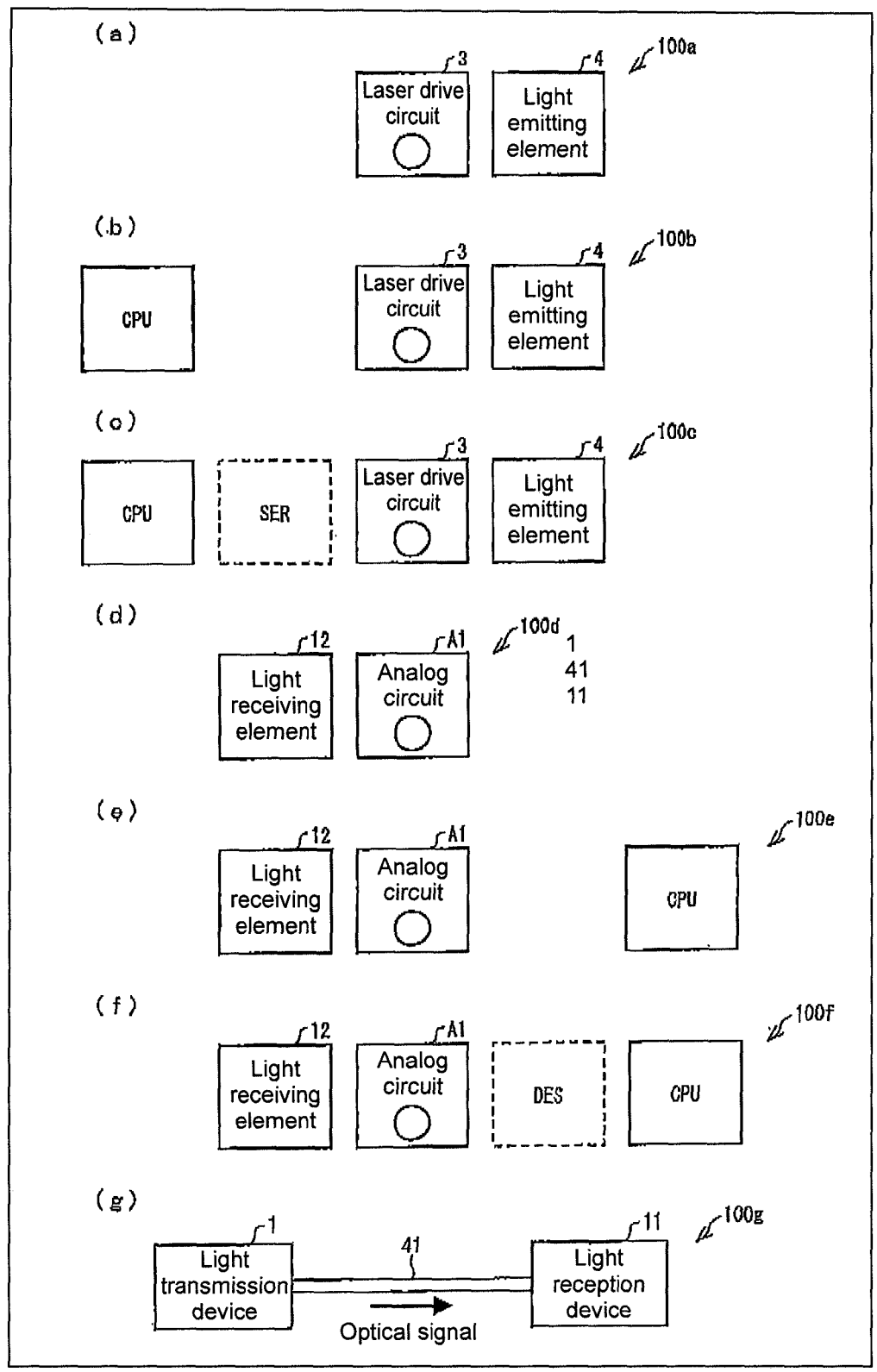
FIGS. 18(a) to 18(g) are views showing one embodiment of the present invention, and are views showing a schematic configuration of a light transmission module according to one or more embodiments of the present invention.

FIGS. 18(*a*) to 18(*g*) are all views showing a schematic configuration of the light transmission module according to one or more embodiments of the present invention.

A light transmission module 100*a* shown in FIG. 18(*a*) is configured to include the laser drive circuit 3 and the light emitting element 4 as the light transmission device 1. The light transmission module 100*a* shown in FIG. 18(*a*) may be a light transmission module 100*b* that further includes a CPU (Central Processing Unit) (see FIG. 18(*b*)). The light transmission module 100*b* shown in FIG. 18(*b*) may be a light transmission module 100*c* that further includes a serializer SER for converting the electric signal from a parallel signal to a serial signal (see FIG. 18(*c*)). The light transmission module 100*c* may have a clock embedded function.

The light transmission modules 100*a* to 100*c* shown in FIG. 18(*a*) to FIG. 18(*c*) may also be a configuration in which the transmission medium (light guide 41, optical fiber, and the like) is connected to the light transmission device 1.

In the light transmission modules 100*a* to 100*c*, the light transmission device 1 suitably has a configuration of including any one of the light transmission devices 1*a* to 1*c*.

The light transmission modules 100*a* to 100*c* are a light transmission module for transmitting the optical signal to the outside.

A light transmission module 100*d* shown in FIG. 18(*d*) is configured to include the light receiving element 12 and the analog circuit A1 as the light reception device 11. The analog circuit A1 may include an amplifier (not shown). The light transmission module 100*d* shown in FIG. 18(*d*) may be a light transmission module 100*e* that further includes a CPU (see FIG. 18(*e*)). The light transmission module 100*e* shown in FIG. 18(*e*) may be a light transmission module 100*f* that further includes a deserializer DES for converting the electric signal from a serial signal to a parallel signal (see FIG. 18(*f*)). The light transmission module 100*e* may have a clock recovery function.

The light transmission modules 100*d* to 100*f* shown in FIG. 18(*d*) to FIG. 18(*f*) may also be a configuration in which the transmission medium is connected to the light reception device 11.

In the light transmission modules 100*d* to 100*f*, the light reception device 11 suitably has a configuration of including any one of the light reception devices 11*a* to 11*d*.

The light transmission modules 100*d* to 100*f* are a light reception module for receiving the optical signal from the outside.

In the light reception module, the LIA and the TIA (Trance Impedance Amplifier) may be separately arranged, or one or a plurality of amplifiers having substantially the same function as the LIA and the TIA may be arranged as the amplifier of the analog circuit A1 of the light reception device 11.

In the light reception module, a CDR may be arranged after the post-stage of the amplifier of the light reception device 11. In the light reception module, a liquid crystal drive circuit, and the like may be arranged after the post-stage of the amplifier of the light reception device 11.

Furthermore, the light transmission module according to one or more embodiments of the present invention may be a light transmission module in which the transmission medium is incorporated in the light transmission device 1 or the light reception device 11.

The light transmission module according to one or more embodiments of the present invention may be a light transmission module 100g in which the light transmission device 1 and the light reception device 11 are connected by the light guide 41 (or optical fiber) (see FIG. 18(g)). In this case, the light transmission device 1 and the light reception device 11 can be implemented by combining one of the light transmission devices 1 described above and one of the light reception devices 11 described above.

According to the above configuration, a light transmission module capable of reducing the power consumption can be realized.

Eleventh Embodiment

Figure 19:
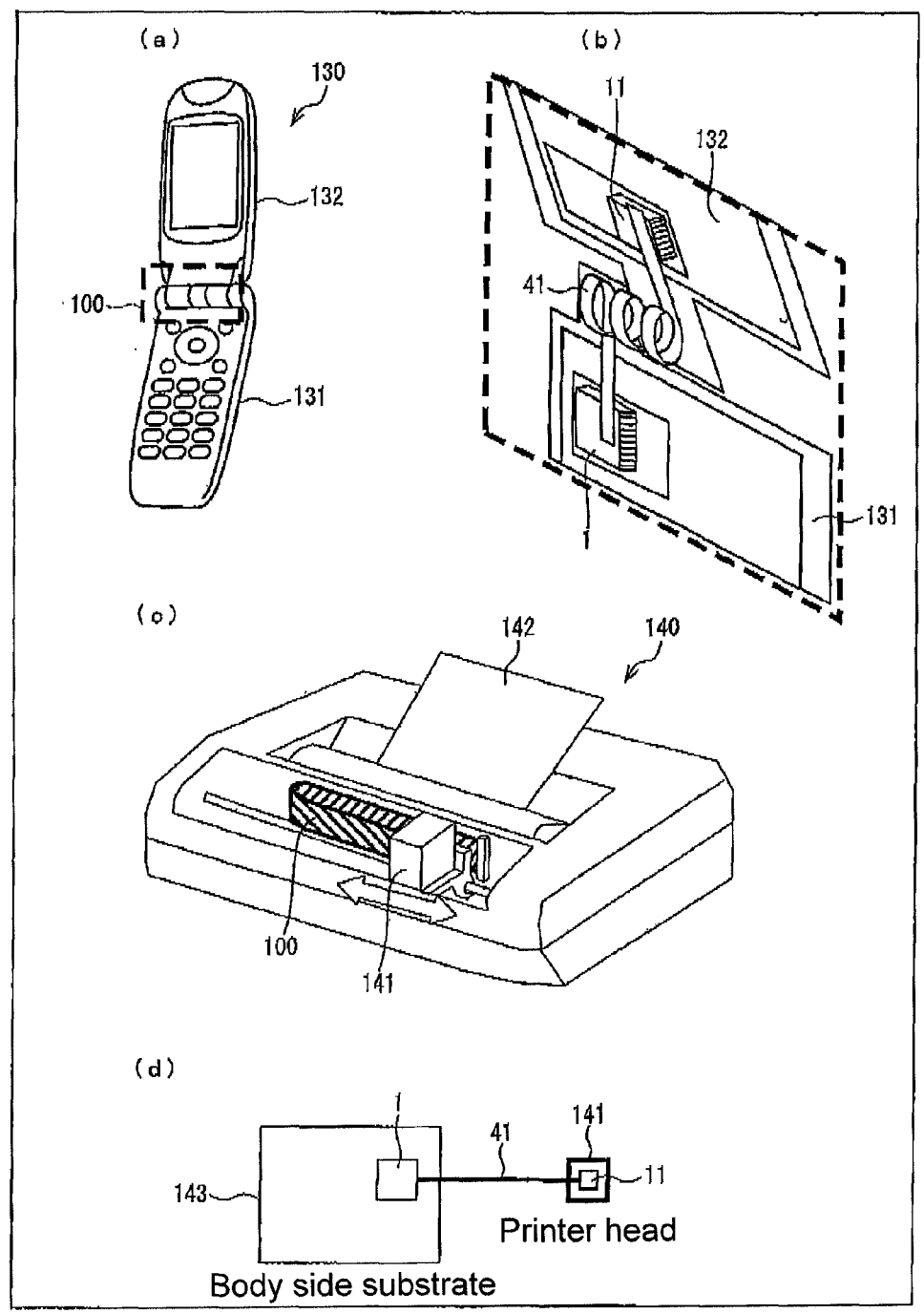
FIGS. 19(a) to 19(d) are a schematic view of a portable telephone that performs data communication by the light transmission module, a perspective view of the internal circuit of the portable telephone that performs data communication by the light transmission module, a schematic view of a printer that performs data communication by the light transmission module, and a block diagram of the internal circuit of the printer that performs data communication by the light transmission module.

An electronic device including the light transmission module according to one or more embodiments of the present invention described in the above embodiment will be described using FIG. 19 and FIG. 20.

FIG. 19(a) is a schematic view of a portable telephone that performs data communication by the light transmission module according to one or more embodiments of the present invention. FIG. 19(b) is a perspective view of the internal circuit of the portable telephone that performs data communication by the light transmission module.

A portable telephone 130 shown in FIG. 19(a) has a signal processing circuit substrate 131 and a liquid crystal driver circuit substrate 132 including a display unit connected by the light transmission module 100. Specifically, as shown in FIG. 19(b), the light transmission device 1 and the signal processing circuit substrate 131 are connected, the light reception device 11 and the liquid crystal driver circuit substrate 132 are connected, and the light transmission device 1 and the light reception device 11 are connected by the light guide 41 (or optical fiber).

The data communication between the signal processing circuit substrate 131 and the liquid crystal driver circuit substrate 132 in the portable telephone 130 then can be carried out. In other words, the information stored on the signal processing circuit substrate 131 side can be displayed on the display unit arranged on the liquid crystal driver circuit substrate 132 side.

FIG. 19(c) is a schematic view of a printer that performs data communication by the light transmission module. FIG. 19(d) is a block diagram of the internal circuit of the printer that performs data communication by the light transmission module.

A printer 140 shown in FIG. 19(c) has a printer head 141 and a substrate 143 on the printer body side (see FIG. 19(d)) connected by the light transmission module 100. Specifically, as shown in FIG. 19(d), the light transmission device 1 and the substrate 143 on the printer body side are connected, the light reception device 11 and the printer head 141 are connected, and the light transmission device 1 and the light reception device 11 are connected by the light guide 41.

The data communication between the printer head 141 and the substrate 143 on the printer body side in the printer 140 then can be carried out. In other words, in FIG. 19(c), information related to characters and images stored on the substrate 143 on the printer body side (see FIG. 19(d)) are transmitted to the printer head 141. The printer head 141 that has received the information reads out the characters and the images from the information. The printer head 141 then can print the characters and the images on a paper 142.

Figure 20:
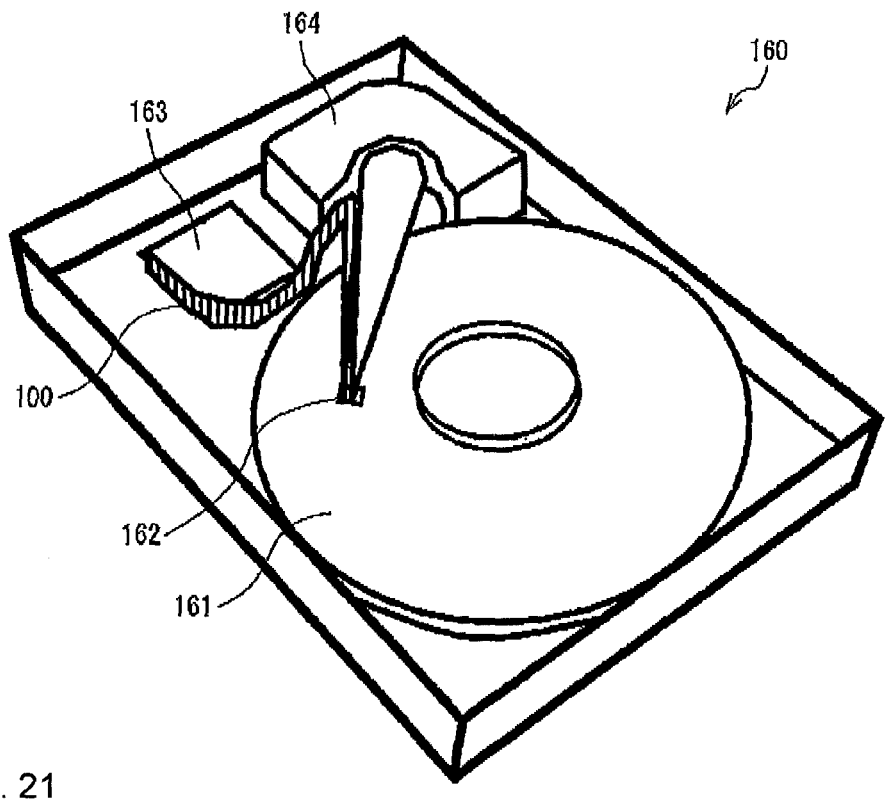
FIG. 20 is a view showing an example in which the light transmission module is applied to a hard disc recording and reproducing device.

FIG. 20 is a view showing an example in which the light transmission module is applied to a hard disc recording and reproducing device.

As shown in FIG. 20, a hard disc recording and reproducing device 160 includes a disc (hard disc) 161, a head (read/write head) 162, a substrate introducing portion 163, a drive portion (drive motor) 164, and the light transmission module 100.

The drive portion 164 drives the head 162 along a radial direction of the disc 161. The head 162 reads the information recorded on the disc 161 and writes the information on the disc 161. The head 162 is connected to the substrate introducing portion 163 by way of the light transmission module 100, and propagates the information read from the disc 161 to the substrate introducing portion 163 as an optical signal and receives the optical signal of the information to be written to the disc 161, propagated from the substrate introducing portion 163.

Therefore, an electronic device capable of carrying out high speed and large capacity communication can be realized by applying the light transmission module 100 to the drive portion such as the head 162 in the hard disc recording and reproducing device 160.

In addition, the light transmission module according to one or more embodiments of the present invention can also be applied to a hinge portion of a foldable electronic device such as a foldable PHS (Personal Handy-phone System), a foldable PDA (Personal Digital Assistant), and a foldable notebook computer. High speed and large capacity communication can be realized in a limited space by applying the light transmission module according to one or more embodiments of the present invention to such foldable electronic devices. Therefore, the light transmission module according to one or more embodiments of the present invention is particularly suited to devices that require high speed and large capacity data communication and that are demanded miniaturization such as foldable liquid crystal display device.

The present invention is not limited to the above embodiments, and various modifications may be made within the scope defined in the Claims. In other words, the embodiments obtained by combining the technical means appropriately modified within the scope of the Claims are also encompassed in the technical scope of the present invention.

One or more embodiments of the present invention can be suitably used in the transmission device for transmitting signals for performing data communication among a plurality of electronic components, the reception device for receiving the signals, and the like.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A transmission device for transmitting a binary signal having a signal of high level and a signal of low level comprising:

a light emitting element for converting an electric signal to an optical signal and transmitting the same; and a drive means for outputting the optical signal from the light emitting element and driving the light emitting element by providing the electric signal to the light emitting element;

wherein the electric signal provided by the drive means to the light emitting element is a waveform deformed signal having a waveform in which a time required for a fall is longer than a time required for a rise in a binary signal having a signal of high level and a signal of low level, wherein the drive means includes a waveform deforming means for deforming the binary signal to the waveform deformed signal and providing to the light emitting element, wherein the drive means is a circuit including a current mirror circuit, and wherein a power supply voltage is applied to that in which the light emitting element and a transistor of the current mirror circuit are connected.

2. The transmission device according to claim 1, wherein the transistor has a threshold value such that a period of the signal of high level becomes short.

3. The transmission device according to claim 1, wherein a period of the signal of high level is shorter in the waveform deformed signal.

4. The transmission device according to claim 3, wherein the transistor has a threshold value such that a period of the signal of high level becomes short.

* * * * *